United States Patent
Kim et al.

(10) Patent No.: US 10,636,946 B2
(45) Date of Patent: Apr. 28, 2020

(54) LIGHT EMITTING DEVICE PACKAGE AND LIGHT SOURCE UNIT

(71) Applicant: LG INNOTEK CO., LTD., Seoul (KR)

(72) Inventors: Ki Seok Kim, Seoul (KR); Won Jung Kim, Seoul (KR); June O Song, Seoul (KR); Chang Man Lim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 11 days.

(21) Appl. No.: 16/070,484

(22) PCT Filed: Sep. 29, 2017

(86) PCT No.: PCT/KR2017/011087
§ 371 (c)(1),
(2) Date: Jul. 16, 2018

(87) PCT Pub. No.: WO2019/045167
PCT Pub. Date: Mar. 7, 2019

(65) Prior Publication Data
US 2019/0334063 A1   Oct. 31, 2019

(30) Foreign Application Priority Data
Sep. 1, 2017  (KR) .................. 10-2017-0112122

(51) Int. Cl.
| | |
|---|---|
| *H01L 33/48* | (2010.01) |
| *H01L 25/075* | (2006.01) |
| *H01L 33/56* | (2010.01) |
| *H01L 33/62* | (2010.01) |
| *H01L 33/22* | (2010.01) |
| *H01L 33/38* | (2010.01) |
| *H01L 33/42* | (2010.01) |
| *H01L 33/46* | (2010.01) |

(52) U.S. Cl.
CPC ........ *H01L 33/486* (2013.01); *H01L 25/0753* (2013.01); *H01L 33/56* (2013.01);
(Continued)

(58) Field of Classification Search
CPC ..... H01L 25/0753; H01L 24/32; H01L 24/08; H01L 2224/32237; H01L 2224/08235;
(Continued)

(56) References Cited

U.S. PATENT DOCUMENTS

| | | | | |
|---|---|---|---|---|
| 2011/0220927 A1* | 9/2011 | Min | ............. | H01L 33/647 257/91 |
| 2012/0262941 A1* | 10/2012 | Min | ............. | H01L 25/0753 257/88 |

(Continued)

FOREIGN PATENT DOCUMENTS

| | | |
|---|---|---|
| EP | 2 709 177 A2 | 3/2014 |
| EP | 2 988 341 A1 | 2/2016 |

(Continued)

*Primary Examiner* — Thanh T Nguyen
(74) *Attorney, Agent, or Firm* — Birch, Stewart, Kolasch & Birch, LLP

(57) ABSTRACT

A light emitting device package is discussed. The light emitting device package includes a first frame having a first through hole; a second frame having a second through hole; a connecting frame diagonally extending in the light emitting device package from the first frame to the second frame; a first light emitting device including a first electrode pad and a second electrode pad, the second electrode pad being disposed on the first through hole of the first frame; and a second light emitting device including a third electrode pad and a fourth electrode pad, the third electrode pad being disposed on the second through hole of the second frame.

21 Claims, 19 Drawing Sheets

(52) U.S. Cl.
CPC .............. *H01L 33/62* (2013.01); *H01L 33/22* (2013.01); *H01L 33/382* (2013.01); *H01L 33/42* (2013.01); *H01L 33/46* (2013.01); *H01L 2933/005* (2013.01); *H01L 2933/0066* (2013.01)

(58) Field of Classification Search
CPC ....... H01L 25/075; H01L 33/48; H01L 33/62; H01L 33/486; H01L 33/56; H01L 2933/0066; H01L 2933/005; H01L 33/46; H01L 33/42; H01L 33/382; H01L 33/02; H01L 33/52
See application file for complete search history.

(56) References Cited

U.S. PATENT DOCUMENTS

| | | | |
|---|---|---|---|
| 2012/0314393 A1* | 12/2012 | Leib | ........................ H01L 24/97 361/809 |
| 2013/0264604 A1 | 10/2013 | Hayashi | |
| 2014/0070249 A1 | 3/2014 | Yoon et al. | |
| 2015/0083996 A1 | 3/2015 | Wang | |
| 2016/0013378 A1* | 1/2016 | Sakamoto | ............... H01L 33/54 257/99 |
| 2016/0056356 A1 | 2/2016 | Oh et al. | |
| 2017/0110637 A1 | 4/2017 | Lim et al. | |
| 2017/0317252 A1 | 11/2017 | Bak et al. | |
| 2018/0019386 A1* | 1/2018 | Lee | ..................... H01L 25/0753 |

FOREIGN PATENT DOCUMENTS

| | | |
|---|---|---|
| JP | 60-12782 A | 1/1985 |
| JP | 2007-214249 A | 8/2007 |
| JP | 2014-130876 A | 7/2014 |
| KR | 10-2016-0003429 A | 1/2016 |
| KR | 10-2016-0057146 A | 5/2016 |
| KR | 10-2016-0077893 A | 7/2016 |
| KR | 10-2017-0037907 A | 4/2017 |
| KR | 10-2017-0044005 A | 4/2017 |
| WO | WO 2016/052898 A1 | 4/2016 |

\* cited by examiner

LIGHT EMITTING DEVICE PACKAGE AND LIGHT SOURCE UNIT

CROSS-REFERENCED TO RELATED APPLICATIONS

This application is the National Phase of PCT International Application No. PCT/KR2017/011087 filed on Sep. 29, 2017, which claims priority under 35 U.S.C. 119(a) to Korean Patent Application No. 10-2017-0112122 filed on Sep. 1, 2017 in Republic of Korea. All of these applications are hereby expressly incorporated by reference into the present application.

BACKGROUND OF THE INVENTION

Technical Field

Embodiments relate to a light emitting device package, a semiconductor device package, a method of manufacturing a semiconductor device package, and a light source unit.

Background Art

A semiconductor device including a compound such as GaN, AlGaN and the like may have many merits such as wide and easily adjustable band gap energy, so that the semiconductor device may be used variously as a light emitting device, a light receiving device, various diodes, and the like.

Specifically, as thin film growth technology and device materials have been developed, a light emitting device, such as a light emitting diode or a laser diode, using a Group III-V or II-VI compound semiconducting material has an advantage capable of realizing light of various wavelength bands such as red, green, blue, and ultraviolet light. In addition, a light emitting device, such as a light emitting diode or a laser diode, using a Group III-V or II-VI compound semiconducting material may realize a white light source with high efficiency by using a fluorescent material or by combining colors. Such a light emitting device has advantages of low power consumption, semi-permanent lifetime, a fast response speed, safety, and environmental friendliness as compared with a conventional light source such as a fluorescent lamp, an incandescent lamps, or the like.

In addition, when a light-receiving device such as a photodetector or a solar cell is fabricated by using a Group III-V or Group-VI-VI compound semiconductor material, since the material of the device material has been developed, light in various wavelength ranges is absorbed to generate optical current, so that light of various wavelength ranges from gamma rays to radio wavelength regions may be used. Further, such a light receiving device may have advantages of a fast response speed, safety, environmental friendliness and easy control of device materials, so that the light receiving device may be easily used for a power control, a microwave circuit or a communication module.

Therefore, the application of the semiconductor device is expanded to a transmitting module of an optical communication transmitting module, a light emitting diode backlight serving as a substitute for a cold cathode fluorescence lamp (CCFL) constituting a backlight of a liquid crystal display (LCD), a white light emitting diode lighting device serving as a substitute for a fluorescent lamp or an incandescent lamp, a vehicle headlight, a signal lamp and a sensor for detecting gas or fire. In addition, the application of the semiconductor device may be expanded to a high-frequency application circuit, other power control devices, and a communication module.

A light emitting device may serve as a p-n junction diode having a characteristic of converting electric energy into light energy by using group III-V or II-VI elements of the periodic table, and may provide various wavelengths by controlling the composition ratio of compound semiconductors.

For instance, a nitride semiconductor represents superior thermal stability and wide band gap energy so that the nitride semiconductor has been spotlighted in the field of optical devices and high-power electronic devices. In particular, blue, green, and UV light emitting devices employing the nitride semiconductor have already been commercialized and extensively used.

For example, an ultraviolet light emitting device may be used as a light emitting diode that emits light distributed in a wavelength range of 200 nm to 400 nm, used for sterilization and purification in the case of a short wavelength in the wavelength band, and used for an exposure machine, a curing machine, or the like in the case of a long wavelength.

Ultraviolet rays may be divided into three groups of UV-A (315 nm to 400 nm), UV-B (280 nm to 315 nm) and UV-C (200 nm to 280 nm) in the order of long wavelength. The UV-A (315 nm~400 nm) has been applied to various fields such as UV curing for industrial use, curing of printing ink, an exposure machine, discrimination of counterfeit, photocatalytic disinfection, special illumination (aquarium/agriculture and the like), the UV-B (280 nm to 315 nm) has been used for medical use, and the UV-C (200 nm~280 nm) has been applied to air purification, water purification, sterilization products, and the like.

Meanwhile, as a semiconductor device capable of providing a high output has been requested, a semiconductor device capable of increasing an output by applying a high power source has been studied.

In addition, research on a method for improving the light extraction efficiency of a semiconductor device and enhancing the luminous intensity in a package stage in a semiconductor device package has been studied. Further, in the semiconductor device package, studies on a method of enhancing the bonding strength between the package electrode and the semiconductor device have been performed.

In addition, in the semiconductor device package, studies on a method for reducing the manufacturing cost and improving the manufacturing yield by improving the process efficiency and changing the structure have been performed.

An embodiment may provide a semiconductor device package or a light emitting device package having a plurality of semiconductor devices or a plurality of light emitting devices.

An embodiment may provide a semiconductor device package or a light emitting device package in which a plurality of semiconductor devices or a plurality of light emitting devices are arranged on at least three frames spaced apart from each other.

An embodiment may provide a semiconductor device package or a light emitting device package in which a plurality of semiconductor elements or a plurality of light emitting elements spaced apart from each other on at least three frames spaced apart from each other are connected to a conductive layer.

An embodiment provides a semiconductor device package or a light emitting device package in which a conductive layer is disposed in three through holes of at least three frames spaced apart from each other to improve adhesion between the conductive layer, a bonding part of each device, the conductive layer, and the frames.

An embodiment provides a semiconductor device package or a light emitting device package in which a semiconductor device or a bonding part of a light emitting device facing a through-hole of a frame is electrically connected to a conductive layer.

An embodiment provides a semiconductor device package or a light emitting device package capable of selectively switching a plurality of light emitting devices in series or in parallel.

An embodiment may provide a semiconductor device package or a light emitting device package capable of improving light extraction efficiency and electrical characteristics.

An embodiment may provide a semiconductor device package or a light emitting device package capable of reducing manufacturing cost and improving manufacturing yield by improving process efficiency and introducing a new package structure.

An embodiment may provide a semiconductor device package or a light emitting device package capable of preventing a re-melting phenomenon from occurring in a bonding region of a semiconductor device package in a process of re-bonding the semiconductor device package to a substrate or the like.

According to the embodiments, there is provided a light emitting device package which includes: first to fourth frames spaced apart from each other; a conductive layer disposed in first to fourth through-holes disposed through upper and lower surfaces of the first to fourth frames, respectively; a body supporting the first to fourth frames; a first light emitting device comprising a first bonding part electrically connected to the first frame and a second bonding part electrically connected to the second frame; and a second light emitting device comprising a third bonding part electrically connected to the third frame and a fourth bonding part electrically connected to the fourth frame, wherein the first to fourth through-holes overlap the first to fourth bonding parts in a vertical direction, respectively, and the first to fourth bonding parts contact the conductive layer.

According to an embodiment, a minimum distance between centers of the first to fourth through-holes respectively disposed in the first to fourth frames and end portions of the first to fourth frames may be 80 μm or more.

According to an embodiment, the light emitting device package may further include a connecting frame connecting the second and third frames to each other, and the connecting frame may be spaced part from each of the first and fourth frames According to an embodiment, an end portion of the first frame facing the second frame may have a concave portion, the end portion of the first frame is adjacent to the second frame, and the concave portion may be concave in a direction toward the first through-hole at the end portion of the first frame.

According to an embodiment, the light emitting device package may further includes a fifth through-hole disposed through upper and lower surfaces of the connecting frame, wherein the connecting frame includes first and second connecting parts separated from each other by the fifth through-hole, the first connecting part is connected to the second frame, and the second connecting part is connected to the third frame.

According to an embodiment, a width of the fifth through-hole may be larger than a width of the connecting frame, and a width direction of the fifth through-hole may be equal to a width direction of the connecting frame.

According to an embodiment, a minimum distance between the first and second connecting parts may be less than the width of the fifth through-hole.

According to an embodiment, the light emitting device package may further includes a conductive layer disposed in the fifth through hole of the connecting frame, wherein the conductive layer disposed in the fifth through hole may be connected to the first and second connecting parts.

According to an embodiment, the conductive layer disposed in the fifth through hole of the connecting frame may include a material different from materials of the first to fourth frames.

According to an embodiment, a resin material may be disposed in the fifth through-hole of the connecting frame.

According to an embodiment, a first recess recessed in a direction toward a lower surface of the body disposed between the first and second through-holes may be disposed on an upper portion of the body, a second recess recessed in a direction toward the lower surface of the body disposed between the third and fourth through-holes may be disposed on the upper portion of the body, the first recess may overlap the first light emitting device in a vertical direction, and the second recess may overlap the second light emitting device in the vertical direction.

According to an embodiment, first resin may be disposed in the first and second recesses.

According to an embodiment, a virtual line having the shortest length between the first and second through-holes may be aligned, the first recess may extend in a direction perpendicular to the virtual line, and a length of the first recess in the extending direction of the first recess may be longer than a width of the first light emitting device.

According to an embodiment, the light emitting device package may further include an inner wall part between the first and second light emitting devices, a height of the inner wall part may be higher than upper surfaces of the first and second light emitting devices, and the inner wall part may make contact with the body and the first to fourth frames.

According to an embodiment, the first and second frames may be spaced apart from each other at one side of the inner wall frame, and the third and fourth frames may be spaced apart from each other at an opposite side of the inner wall part, According to an embodiment, a concave cavity may be disposed on circumferences of the first and second light emitting devices.

According to an embodiment, the body may include a connecting recess recessed in a direction toward the upper surface of the body on a lower surface of the body between the second and third frames and recessed toward an upper surface of the body, and a conductive layer electrically connecting the second and third frames to the connecting recess.

According to the semiconductor device package and the method of manufacturing a semiconductor device package of an embodiment, the conductive layer may be provided in the through-hole of the frame in the bonding parts of the semiconductor device or the light emitting device, thereby improving the adhesive force and the electric conductivity of the bonding part.

According to the semiconductor device package and the method of manufacturing a semiconductor device package of an embodiment, it is possible to switch the driving voltage of the package by selectively connecting a plurality of semiconductor devices or a plurality of light emitting devices to a frame or a conductive layer.

According to the semiconductor device package and the method of manufacturing a semiconductor device package of an embodiment, a high-voltage package may be provided.

According to the semiconductor device package and the method of fabricating a semiconductor device package of an embodiment, there is an advantage that the light extraction efficiency, electrical characteristics and reliability may be improved.

According to the semiconductor device package and the method for manufacturing a semiconductor device package of an embodiment, the process efficiency may be improved and a new package structure may be presented, which is advantageous in that the manufacturing cost is reduced and the manufacturing yield is improved.

The semiconductor device package according to an embodiment may have an advantage that the reflector may be prevented from being discolored by providing the body having high reflectance, thereby improving the reliability of the semiconductor device package.

According to the semiconductor device package and the method of manufacturing a semiconductor device of an embodiment, it is possible to prevent a re-melting phenomenon from occurring in the bonding region of the semiconductor device package in the process of re-bonding the semiconductor package to the substrate and the like.

The reliability of the semiconductor device package or the light emitting device package according to an embodiment may be improved.

DETAILED DESCRIPTION OF THE DRAWINGS

Figure 2:
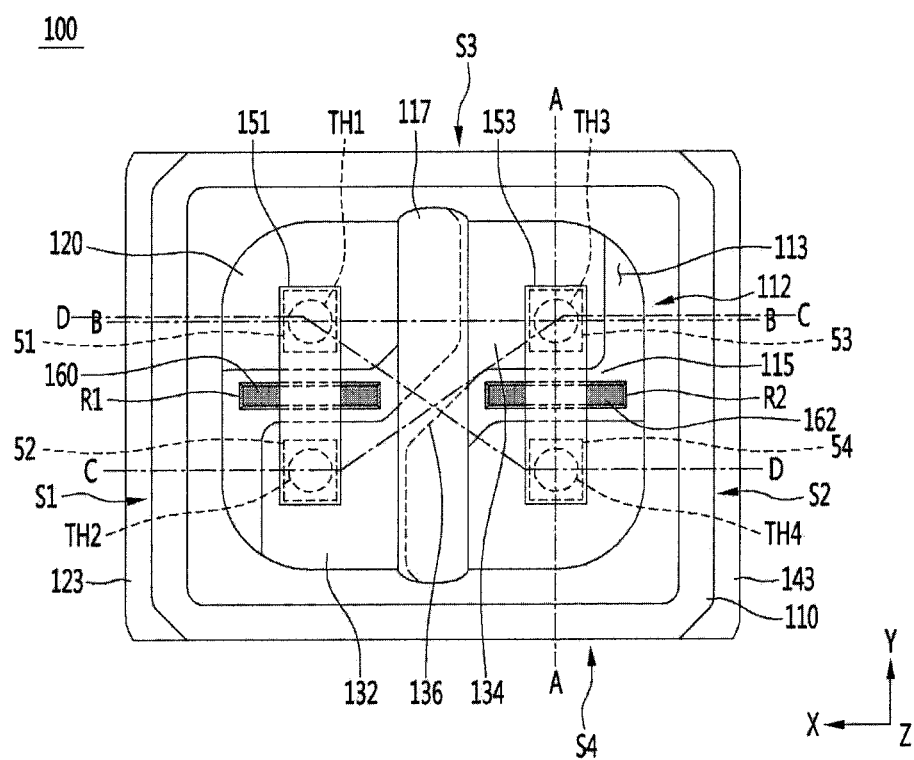
FIG. 2 is a plan view illustrating the semiconductor device package of FIG. 2.
Figure 9:
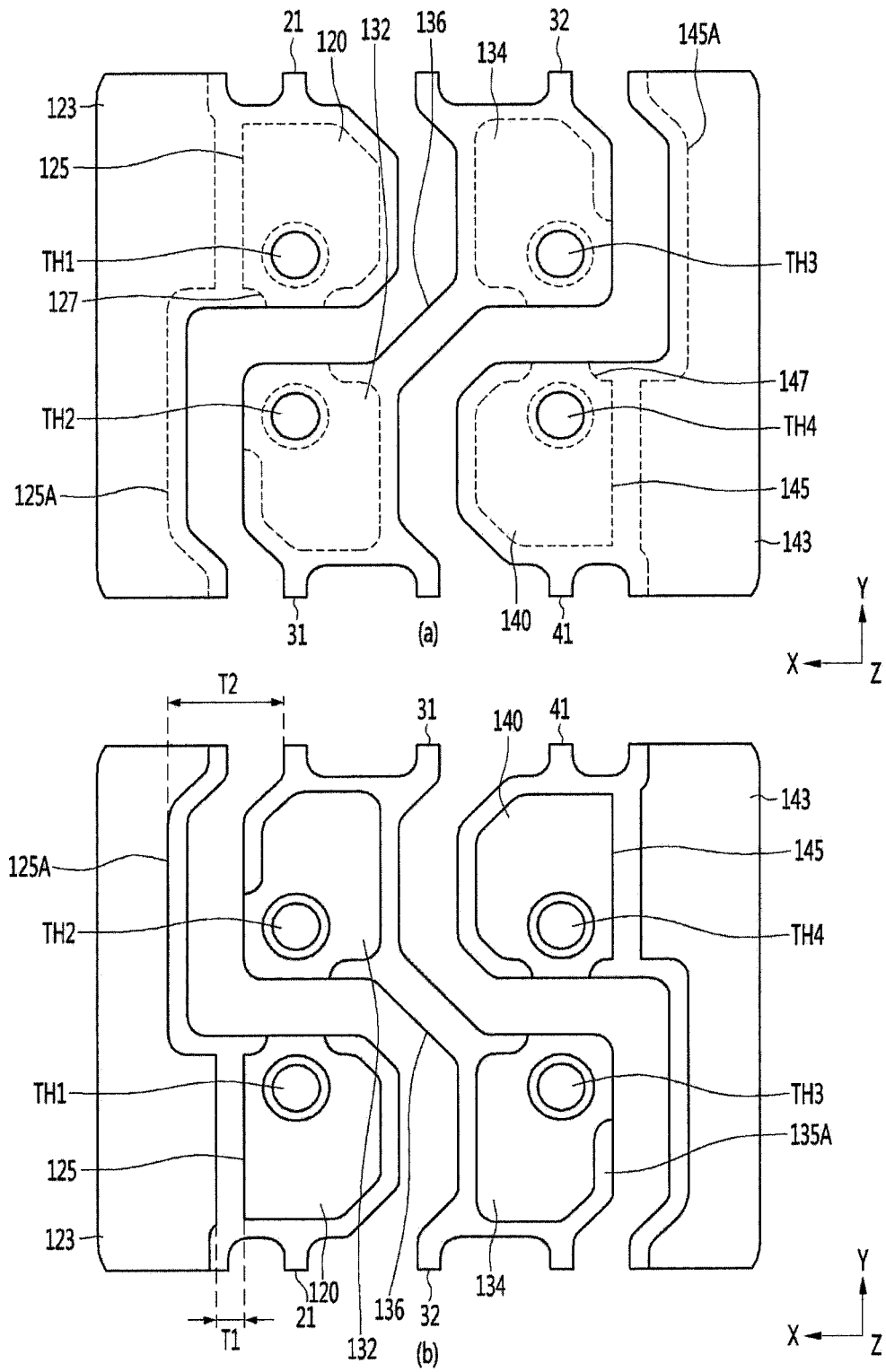

FIGS. 9(*a*) and (*b*) are front and bottom plan views illustrating disassembled frames in the semiconductor device package of FIG. 2.

Figure 10:
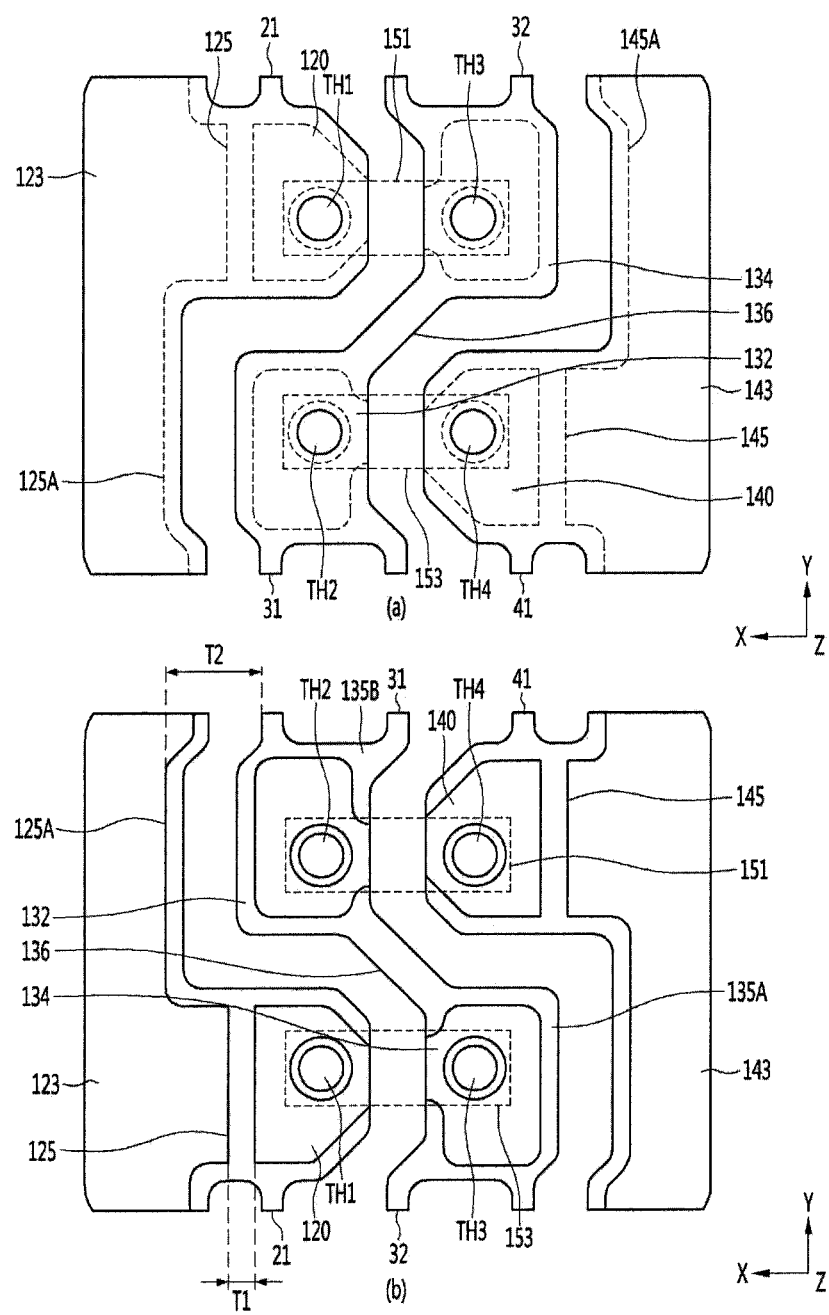

FIGS. 10(*a*) and (*b*) are front and bottom plan views illustrating frames of the semiconductor device package of FIG. 2, which are arranged in another form.

Figure 5:
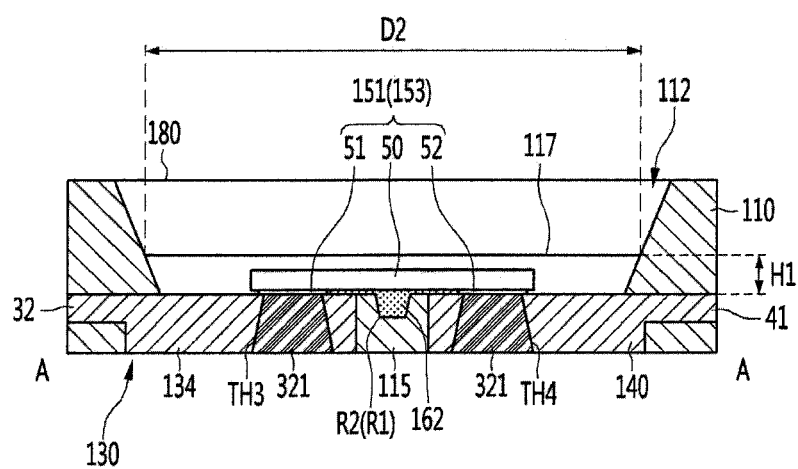
FIG. 5 is a sectional view taken along line A-A of the semiconductor device package of FIG. 2.
Figure 11:
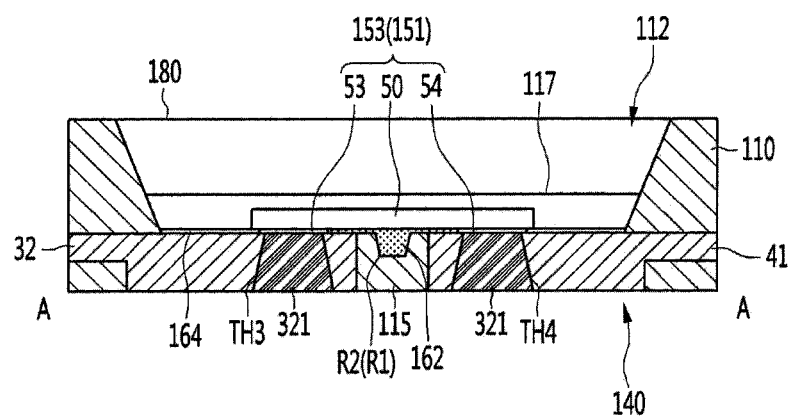

FIG. 11 is a view illustrating a first modification example of the semiconductor device package of FIG. 5.

Figure 12:
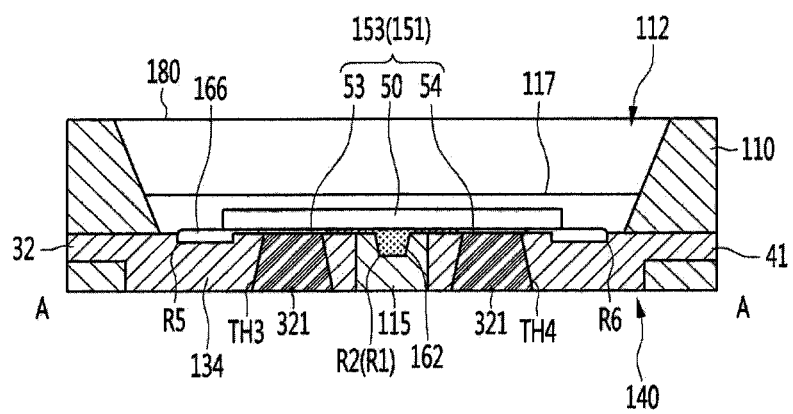

FIG. 12 is a view illustrating a second modification example of the semiconductor device package of FIG. 5.

Figure 13:
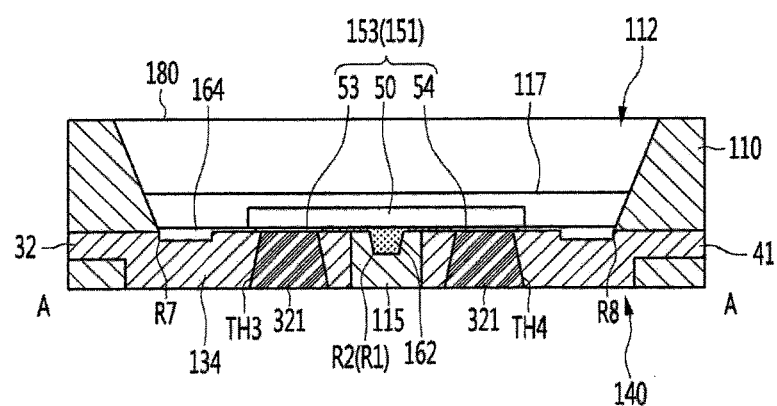

FIG. 13 is a view illustrating a third modification example of the semiconductor device package of FIG. 5.

Figure 14:
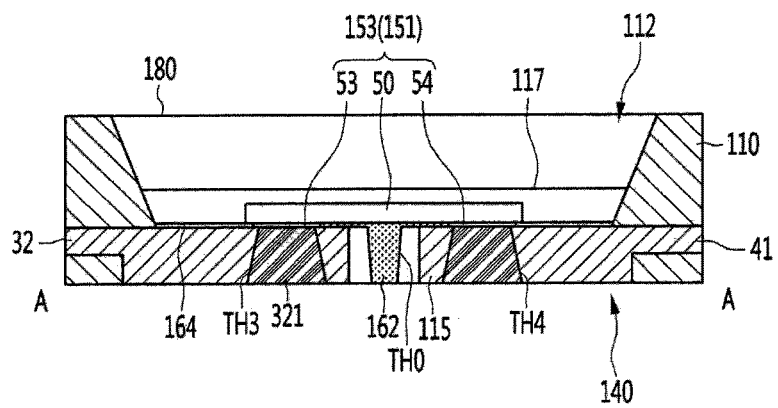

FIG. 14 is a view illustrating a fourth modification example of the semiconductor device package of FIG. 5.

Figure 15:
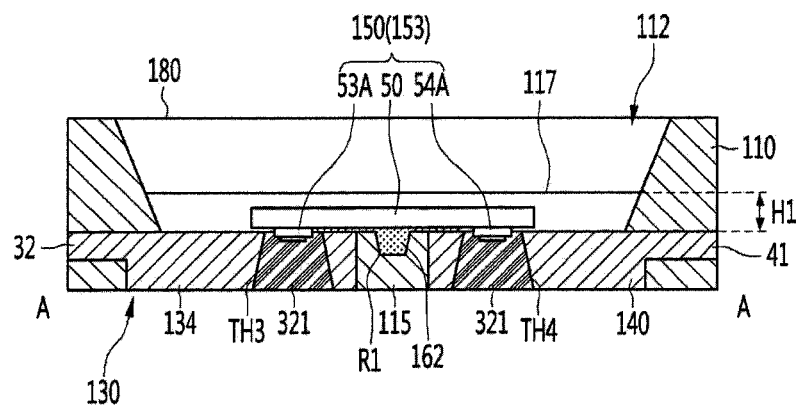

FIG. 15 is a view illustrating another example of a bonding part included in the semiconductor device package of FIG. 5.

Figure 16:
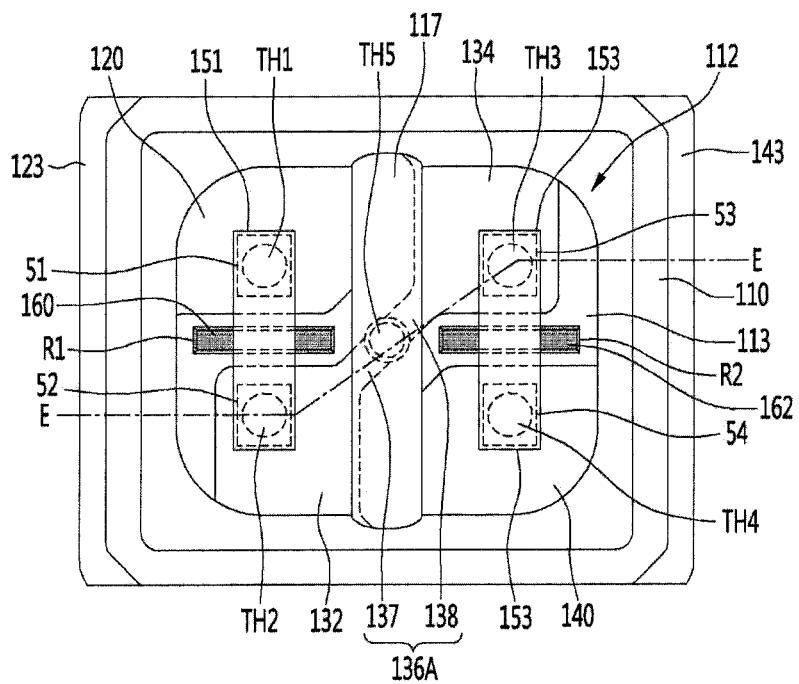

FIG. 16 is a plan view illustrating a semiconductor device package according to a second embodiment.

Figure 17:
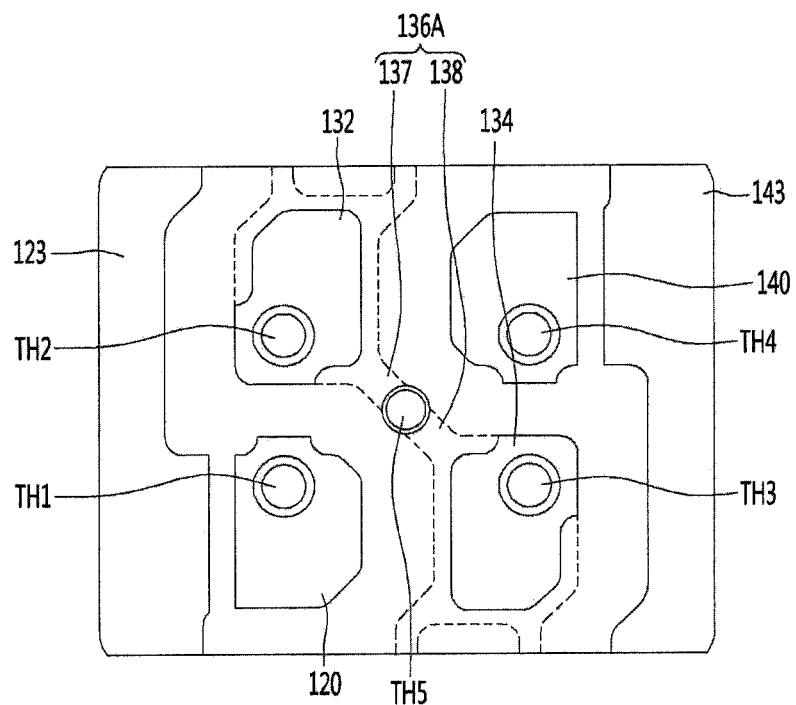

FIG. 17 is a bottom plan view illustrating the semiconductor device package of FIG. 16.

Figure 18:
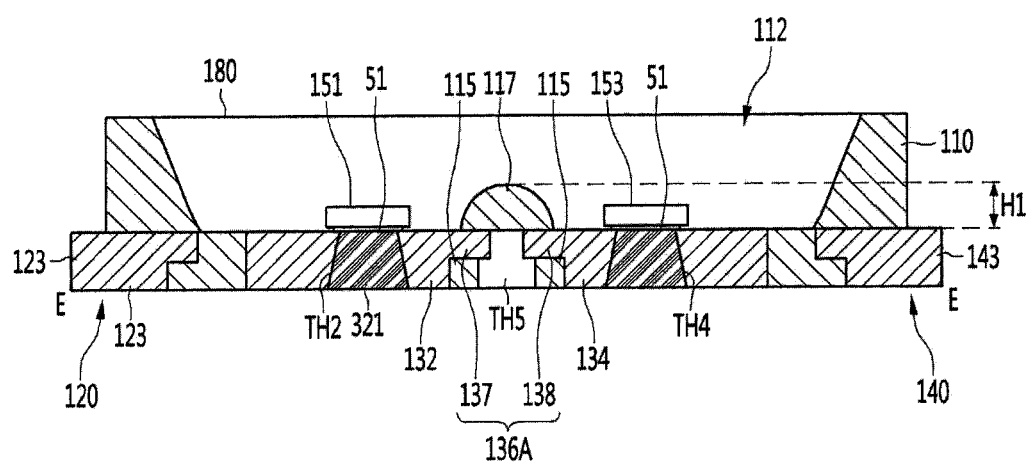

FIG. 18 is a sectional view taken along line E-E of the semiconductor device package of FIG. 16.

Figure 19:
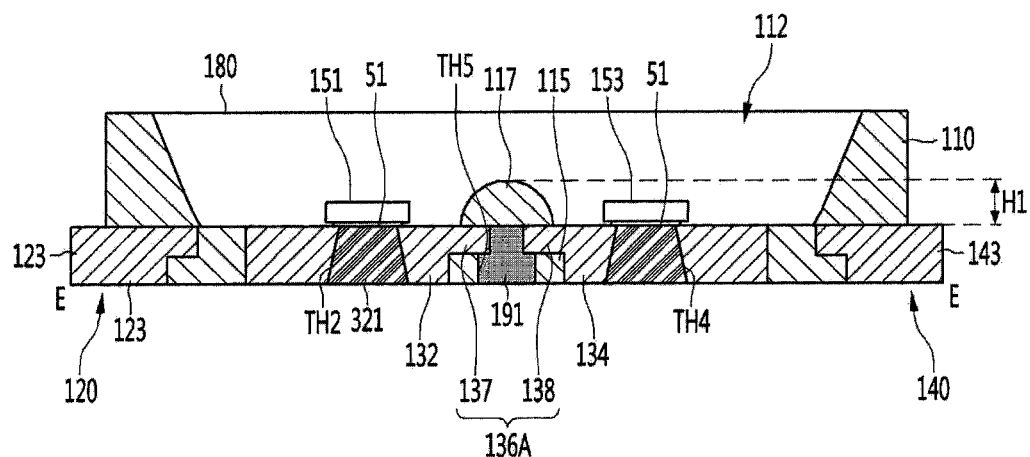

FIG. 19 is a view illustrating an example in which a conductive layer is disposed in a through-hole of a connecting frame of the semiconductor device package of FIG. 18.

Figure 20:
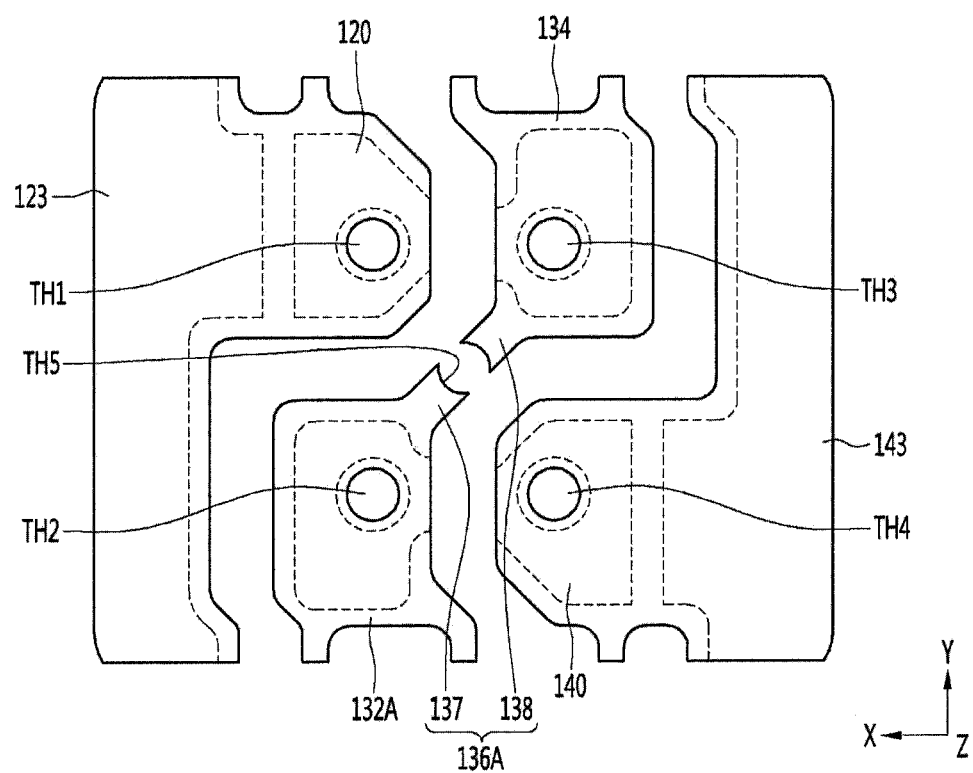

FIG. 20 is a plan view illustrating a frame of the semiconductor device package of FIG. 16.

Figure 21:
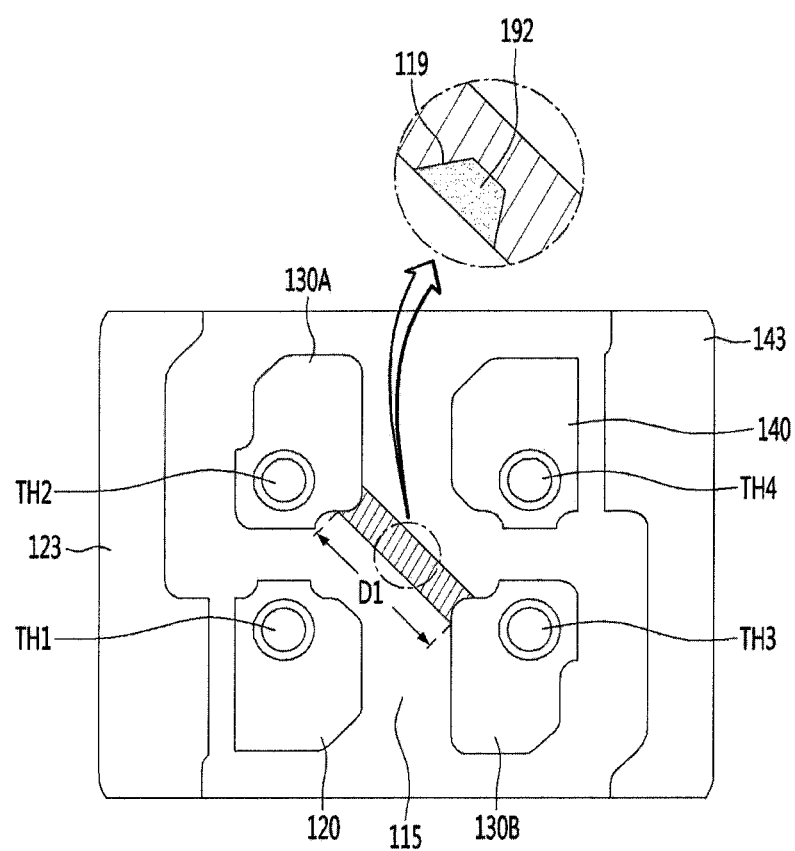

FIG. 21 is a bottom plan view illustrating a semiconductor device package according to a third embodiment.

Figure 22:
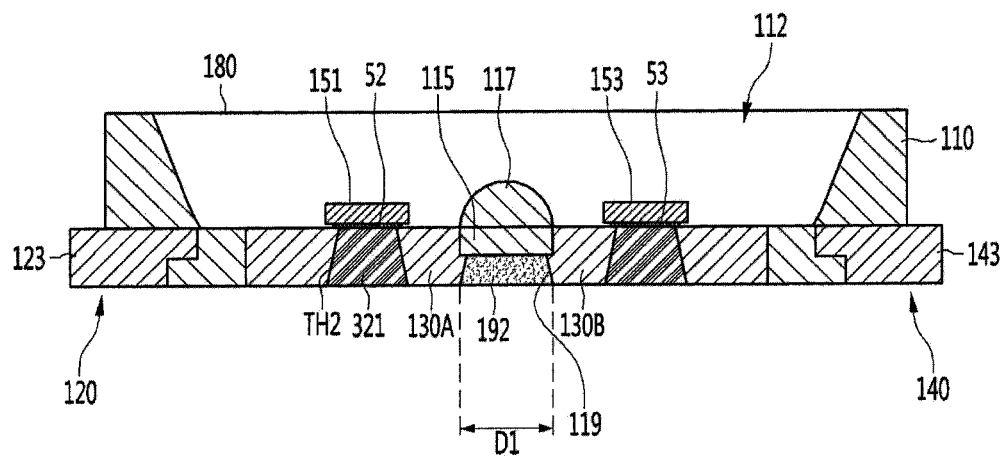

FIG. 22 is a side sectional view illustrating the semiconductor device package of FIG. 21.

Figure 23:
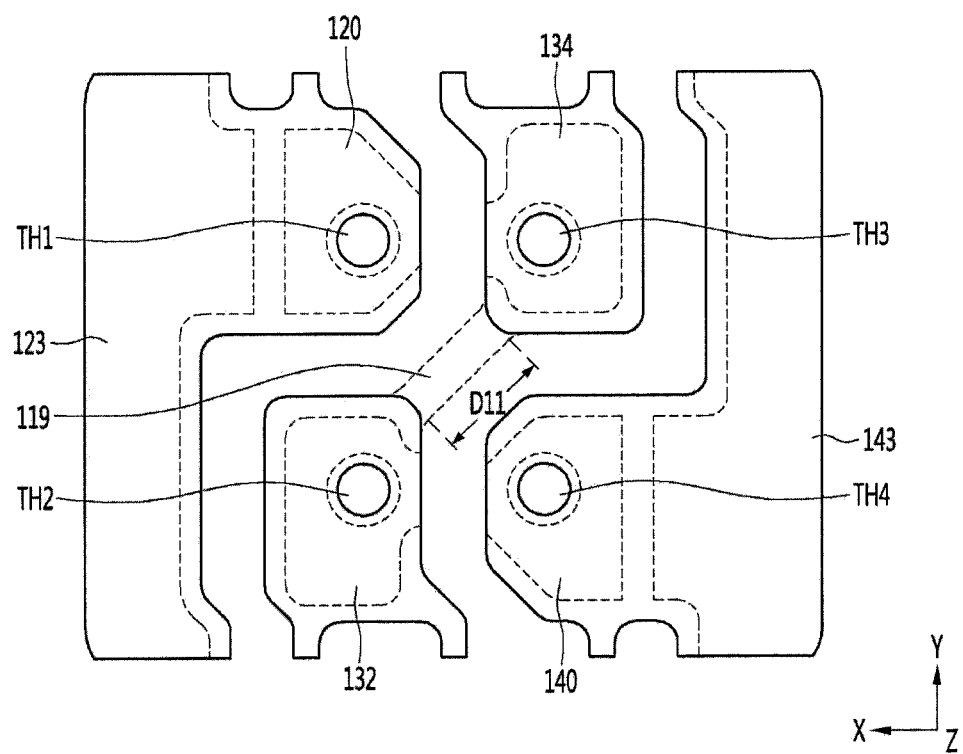

FIG. 23 is a plan view illustrating a frame of the semiconductor device package of FIG. 21.

Figure 24:
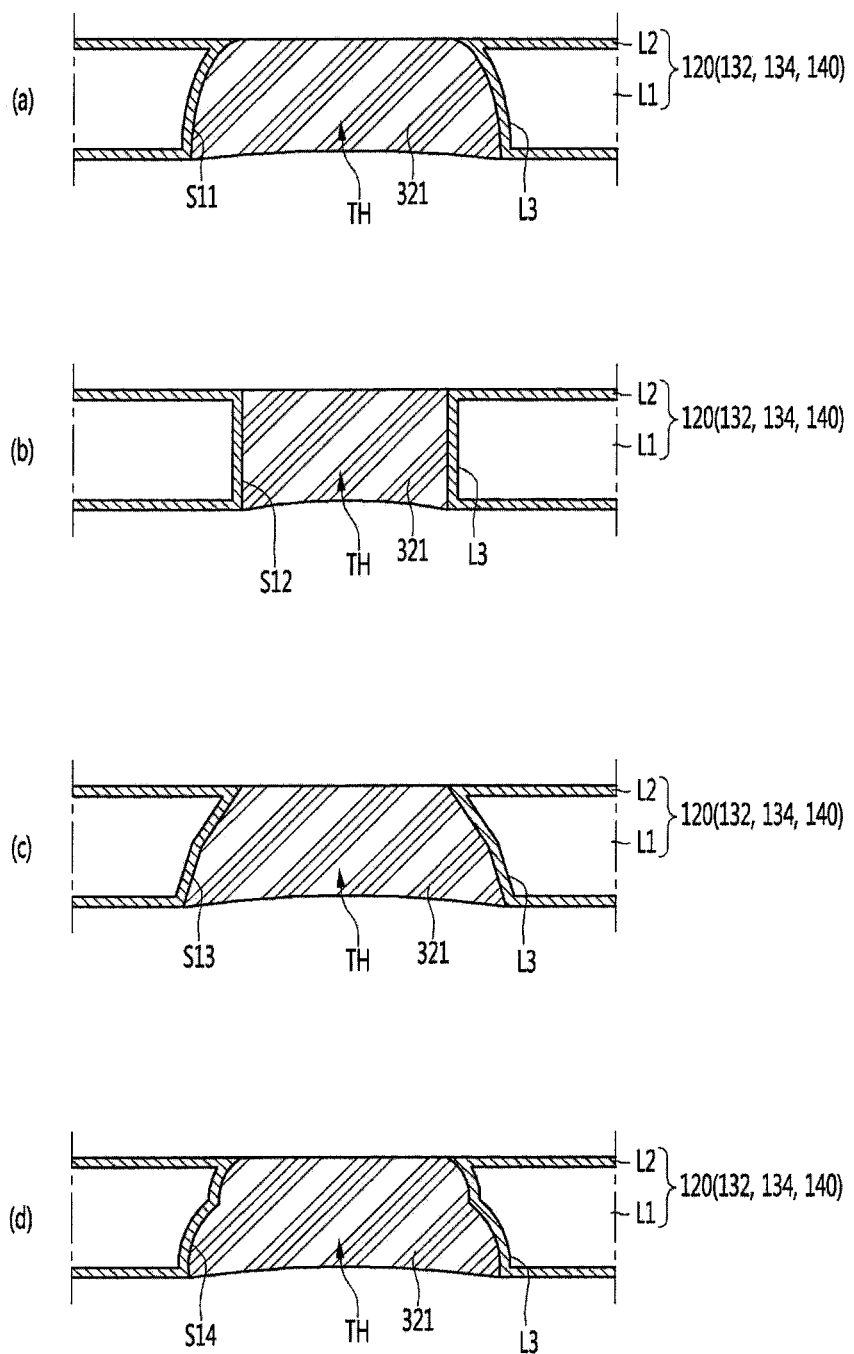

FIG. 24 is other examples illustrating the though-hole of a frame according to an embodiment.

Figure 25:
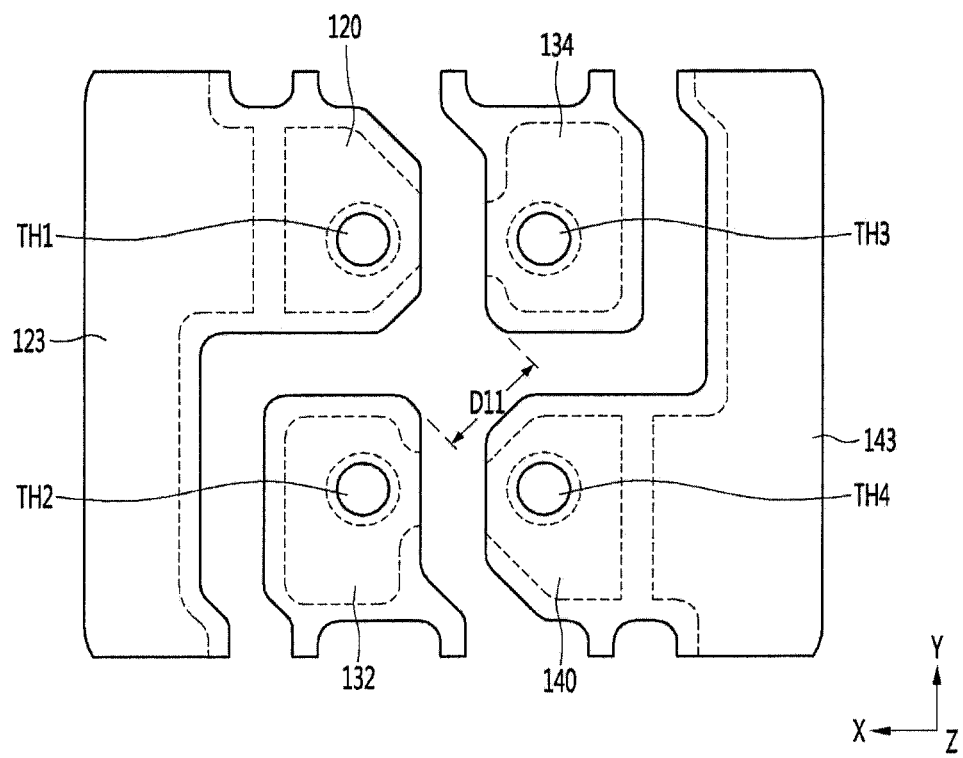

FIG. 25 is a front view illustrating examples of a frame in which a connecting frame is removed from the semiconductor device package according to an embodiment.

Figure 8:
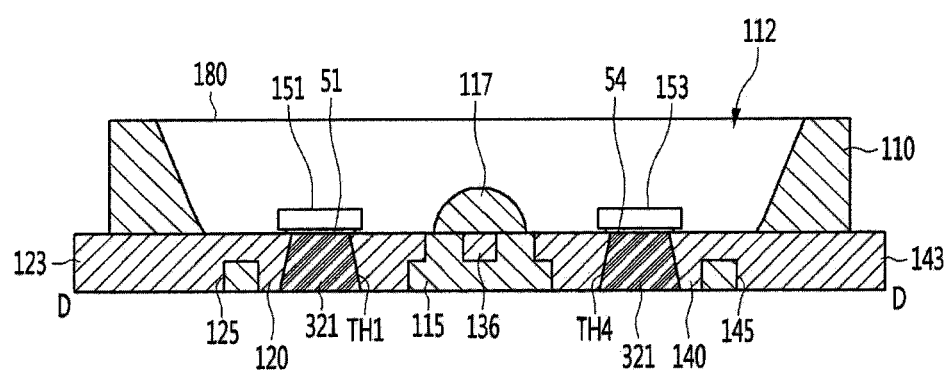
FIG. 8 is a sectional view taken along line D-D of the semiconductor device package of FIG. 2
Figure 26:
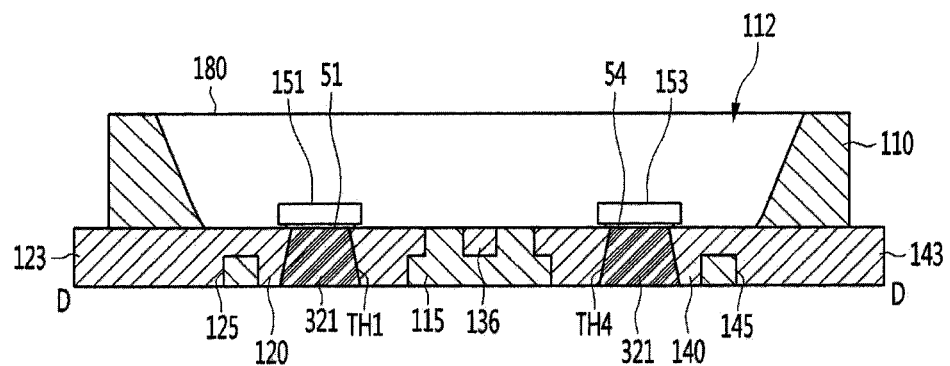

FIG. 26 is a side sectional view illustrating a semiconductor device package according to an embodiment, where an inner wall part is removed as a modification example of FIG. 8.

Figure 27:
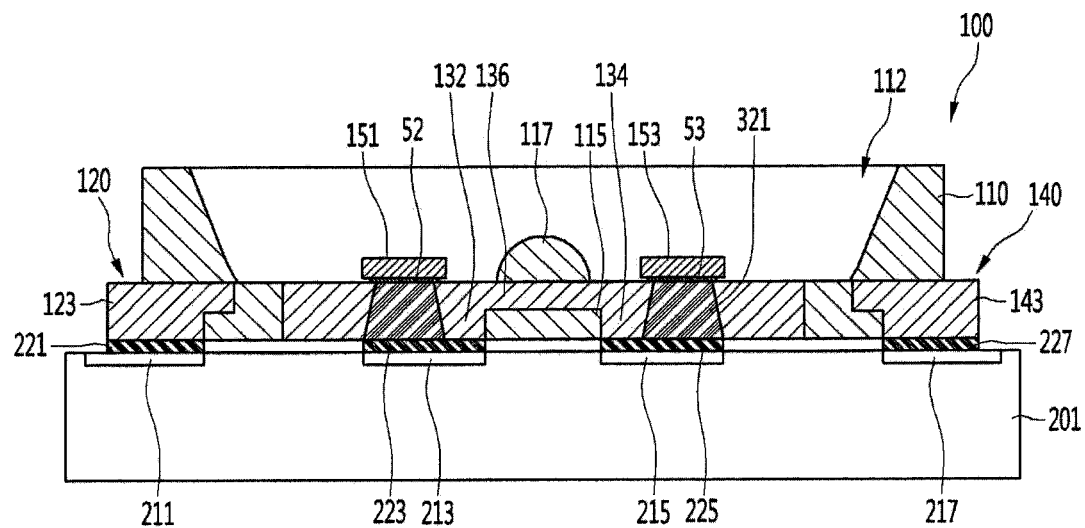

FIG. 27 is a view illustrating an example of a module in which a semiconductor device package according to an embodiment is disposed on a circuit substrate.

Figure 28:
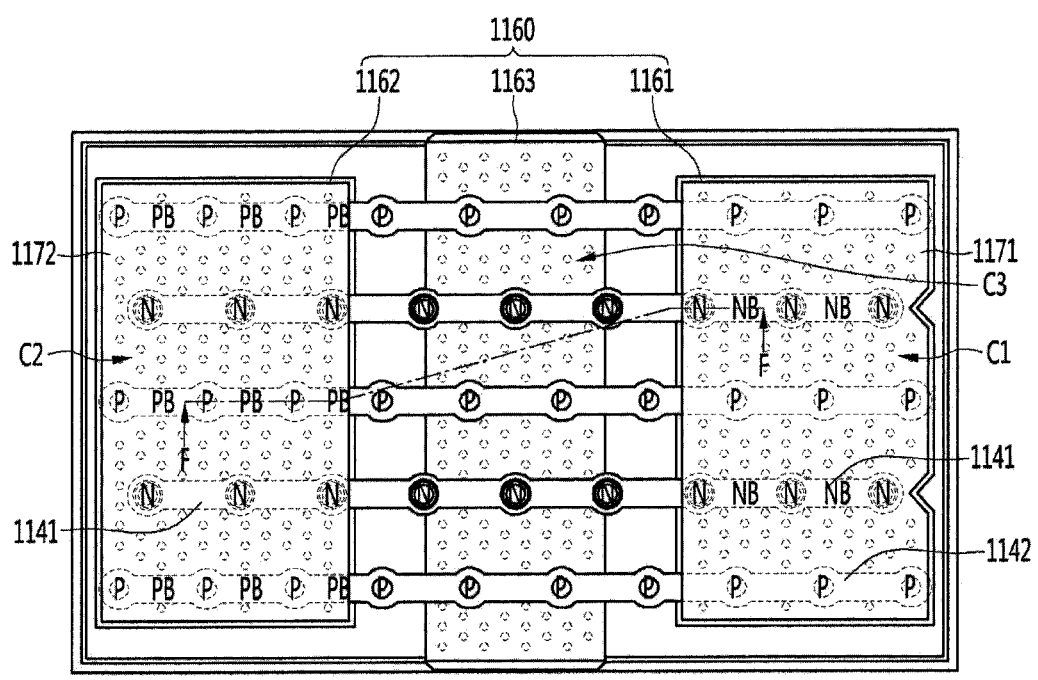

FIG. 28 is a plan view illustrating an example of a device according to an embodiment.

Figure 29:
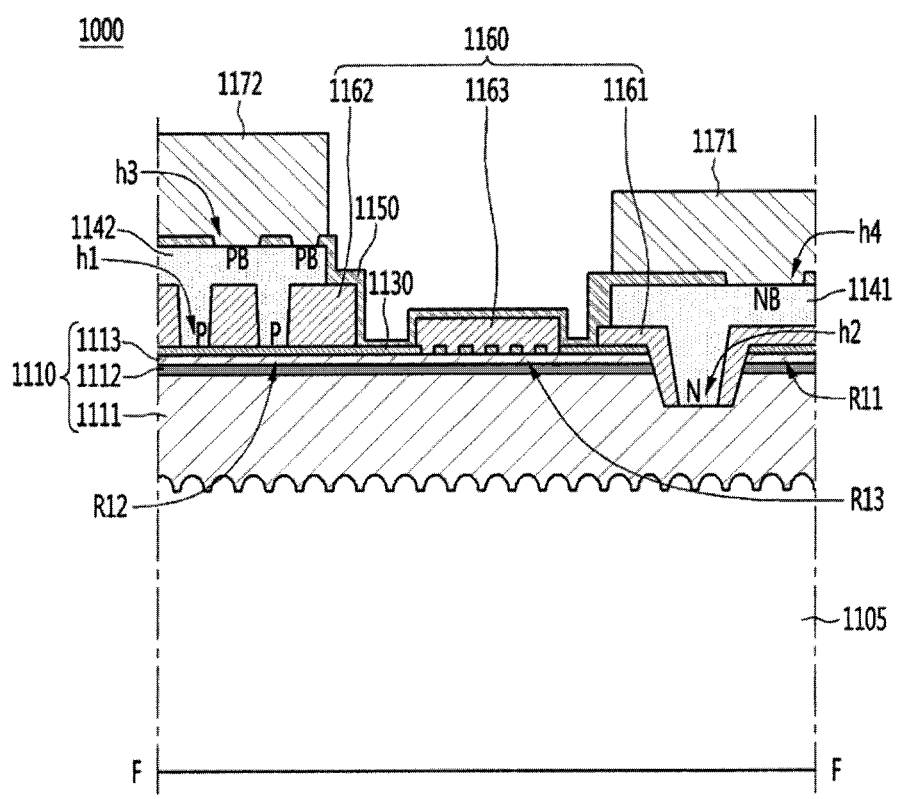

FIG. 29 is a sectional view taken along line F-F of the light emitting device of FIG. 28.

Hereinafter, an embodiment will be described with reference to accompanying drawings. In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings, but the embodiments are not limited thereto.

Hereinafter, a semiconductor device package according to an embodiment will be described in detail with reference to accompanying drawings. The semiconductor device of the device package may include a light emitting device emitting light such as ultraviolet, infrared, or visible light. Hereinafter, as an example of a semiconductor device, a case where a light emitting device is applied will be described, and a package or a light source unit to which the light emitting device is applied may include a non-light emitting device such as a zener diode or a sensing device for monitoring a wavelength or heat. Hereinafter, as an example of a semiconductor device, a case where a light emitting device is applied will be described, and a light emitting device package will be described in detail.

First Embodiment

Figure 1:
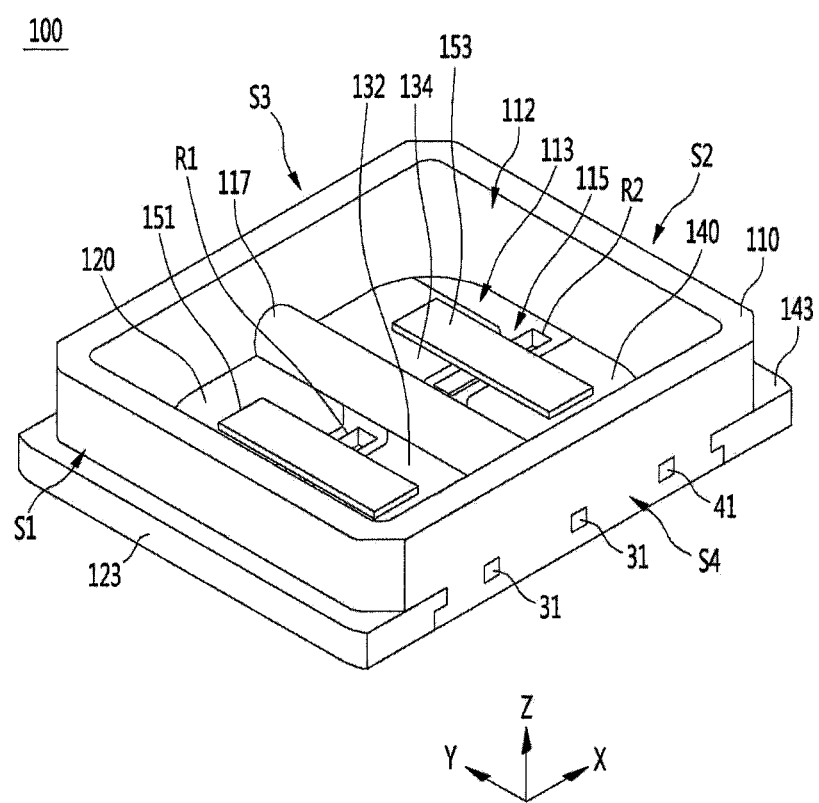
FIG. 1 is a perspective view illustrating a semiconductor device package according to a first embodiment of the present disclosure.
Figure 3:
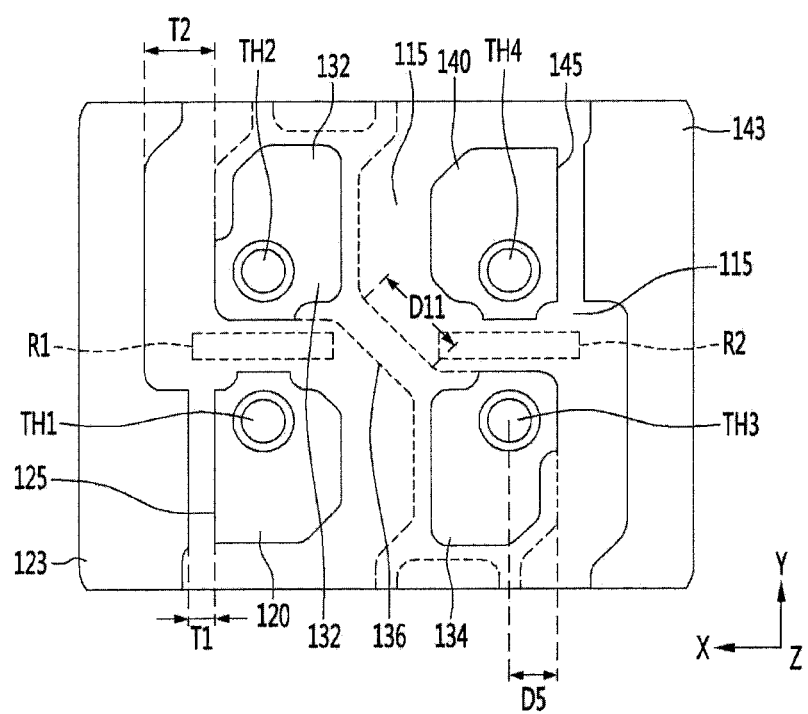
FIG. 3 is a bottom plan view illustrating the semiconductor device package of FIG. 2.
Figure 4:
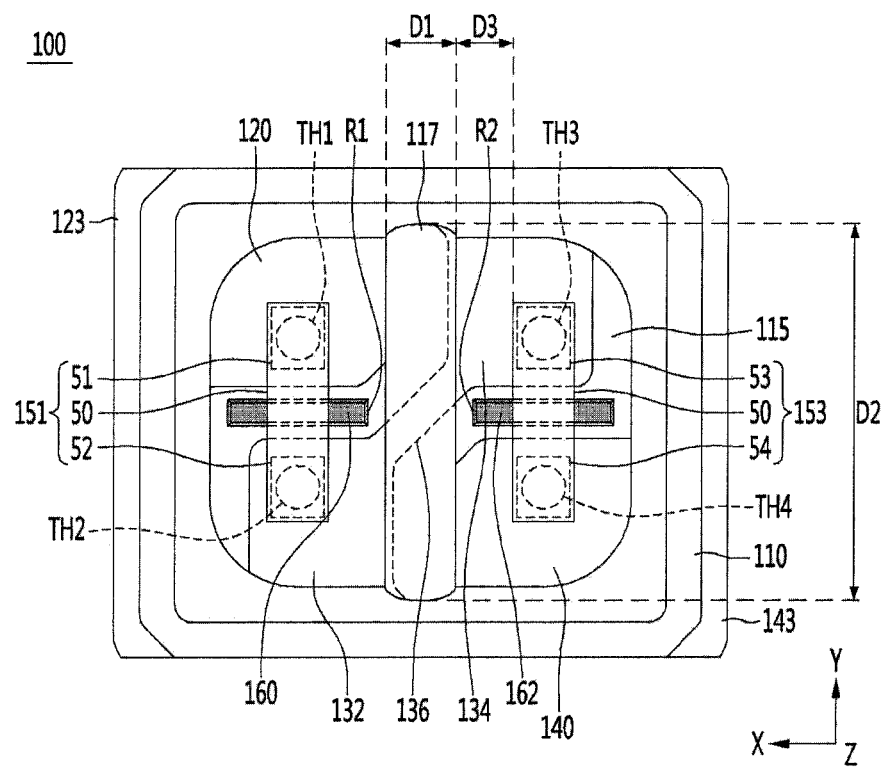
FIG. 4 is a detailed plan view illustrating a device in the semiconductor device package of FIG. 2.
Figure 6:
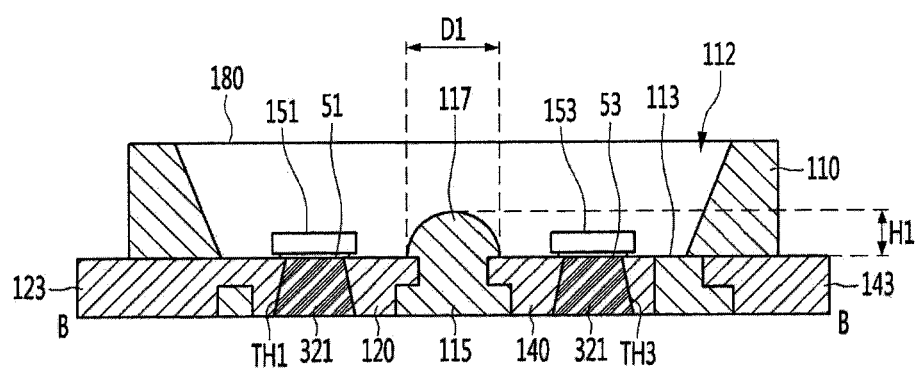
FIG. 6 is a sectional view taken along line B-B of the semiconductor device package of FIG. 2
Figure 7:
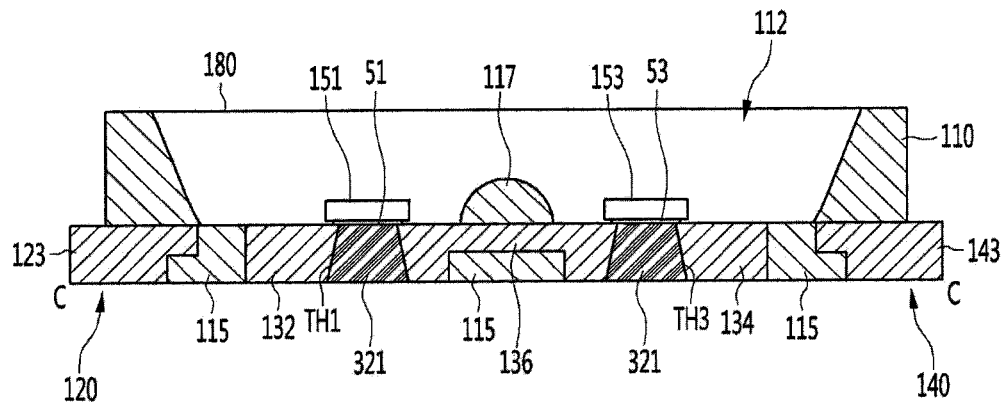
FIG. 7 is a sectional view taken along line C-C of the semiconductor device package of FIG. 2

FIG. 1 is a perspective view illustrating a semiconductor device package according to a first embodiment of the present disclosure. FIG. 2 is a plan view illustrating the semiconductor device package of FIG. 2. FIG. 3 is a bottom plan view illustrating the semiconductor device package of FIG. 2. FIG. 4 is a detailed plan view illustrating a device in the semiconductor device package of FIG. 2. FIG. 5 is a sectional view taken along line A-A of the semiconductor device package of FIG. 2. FIG. 6 is a sectional view taken along line B-B of the semiconductor device package of FIG. 2. FIG. 7 is a sectional view taken along line C-C of the semiconductor device package of FIG. 2. FIG. 8 is a sectional view taken along line D-D of the semiconductor device package of FIG. 2. FIGS. 9(a) and (b) are front and bottom plan views illustrating disassembled frames in the semiconductor device package of FIG. 2.

Referring to FIGS. 1 to 9, a semiconductor device package or a light emitting device package 100 according to an embodiment includes a plurality of frames 120, 132, 134 and 140 spaced apart from each other, a body 115 supporting the frames 120, 132, 134 and 140, a plurality of semiconductor devices or a plurality of light emitting devices 151 and 153 disposed on the frames 120, 132, 134 and 140. Hereinafter, the package in which the light emitting devices 151 and 153 are arranged will be described as a light emitting device package. The light emitting devices 151 and 153 according to an embodiment may be arranged to be individually driven or connected to each other to be driven together. The light emitting device package 100 may change or switch a driving voltage according to the number of connected light emitting devices 151 and 153.

The length of the light emitting device package 100 in a first direction (X) is equal to or different from and that in a second direction (Y). The length of the first direction of the light emitting device package 100 may be at least 2.5 mm, for example in the range of 2.5 mm to 5 mm. The length of the second direction is equal to or longer than that of the first direction. A thickness of the light emitting device package 100 may be less than the lengths of the first and second directions.

A package body 110 may have a length of the first direction and a length of the second direction which are equal to or different from each other. The first direction may be an X direction, the second direction may be a Y direction orthogonal to the X direction, and the third direction may be a Z direction orthogonal to the X and Y directions, but the embodiment is not limited thereto. The length of the package body 110 in the X direction may be longer or shorter than that in the Y direction. When the length in the X direction is longer than the length in the Y direction, the widths of the light emitting devices 151 and 153 in the Y direction may be reduced to improve the brightness. When the length in the Y direction is longer than that in the X direction, the widths of the light emitting devices 151 and 153 in the Y direction may be increased.

The package body 110 may include first and second side parts S1 and S2 facing each other and third and fourth side parts S3 and S4 facing each other. The first and second side parts S1 and S2 may have long lengths in the X direction and may be connected to both ends of the third and fourth side parts S3 and S4. The first to fourth side parts S1 to S4 may be formed to be perpendicular or inclined to the bottom of the body 115.

<Frames 120, 132, 134 and 140>

Referring to FIGS. 2, 3 and 9, the frames 120, 132, 134 and 140 may include at least three frames, for example, first to fourth frames 120, 132, 134 and 140. The first and second frames 120 and 132 may be spaced apart from each other. The first and second frames 120 and 132 may be spaced apart from each other in the first direction (X). The third and fourth frames 134 and 140 may be spaced apart from each other. The third and fourth frames 134 and 140 may be spaced apart from each other in the first direction (X). The first and third frames 120 and 134 may be spaced apart from each other in the second direction (Y) orthogonal to the first direction. The second and fourth frames 132 and 140 may be spaced apart from each other in the second direction. The third direction (Z) may be orthogonal or perpendicular to the first and second directions.

The first to fourth frames 120, 132, 134 and 140 may be provided as conductive frames. The first and second frames 120 and 132 may stably provide the structural strength of the body 115 and may be electrically connected to the first light emitting device 151. The third and fourth frames 134 and 140 may stably provide the structural strength of the body 115 and may be electrically connected to the second light emitting device 153.

When the first to fourth frames 120, 132, 134 and 140 are conductive frames, the first to fourth frames 120, 132, 134 and 140 may be defined as lead frames and may radiate the heat or reflect light generated from the light emitting devices 151 and 153. When the first to fourth frames 120, 132, 134 and 140 may be formed of a conductive material, the first to fourth frames 120, 132, 134 and 140 may include metal, for example, at least one of Pt, Ti, Ni, Cu, Au, Ta, Al, and Ag and may be formed in a single layer or a multi-layer having mutually different metal layers.

As another example, the first to fourth frames 120, 132, 134 and 140 may be provided as insulating frames. When the first to fourth frames 120, 132, 134 and 140 are insulating frames, the first to fourth frames 120, 132, 134 and 140 may stably provide the structural strength of the package body 110. When the first to fourth frames 120, 132, 134 and 140 are insulating frames, the body 115 and the first to fourth frames 120, 132, 134 and 140 may be integrally formed of the same material or may be formed of mutually different materials. The difference between the case where the first to fourth frames 120, 132, 134 and 140 are formed of insulating frames and the case where the first to fourth frames 120, 132, 134 and 140 are formed of conductive frames will be described later.

When the first to fourth frames 120, 132, 134 and 140 are formed of an insulating material, the insulating material may be a resin material or an insulating material. For example, the first to fourth frames 120, 132, 134 and 140 may be formed of at least one selected from the group consisting of polyphthalamide (PPA), polychloro tri phenyl (PCT), liquid crystal polymer (LCP), polyamide 9T (PA9T), silicone, epoxy molding compound (EMC), silicone molding compound (SMC), ceramic, photo sensitive glass (PSG), sapphire (Al2O3), and the like. In addition, the first to fourth frames 120, 132, 134 and 140 may be formed of an epoxy material including a high refraction filler such as TiO2, SiO2, and the like. The first to fourth frames 120, 132, 134 and 140 may include a reflective resin material.

As shown in FIGS. 1 and 2, a first extension part 123 may protrude further outward than the first side part S1 of the package body 110. The first extension part 123 may extend from one of the first and second frames 120 and 132. The first extension part 123 may protrude outward from the first frame 120 through the first side part S1. The length of the first extension part 123 in the X direction is equal to or at least half of the length of the package body 110 in the X direction, thereby preventing the heat radiation area from being reduced and enhancing the bonding strength between the package body 110 and the body 115. The protruding width of the first extension part 123 may be at least 100 μm.

A second extension part 143 may protrude further outward than the second side part S2 of the package body 110. The second extension part 143 may extend from one of the third and fourth frames 134 and 140. The second extension part 143 may protrude outward from the fourth frame 140 through the second side part S2. The length of the second extension part 143 in the X direction is equal to or at least half of the length of the package body 110 in the X direction, thereby preventing the heat radiation area from being reduced and enhancing the bonding strength between the package body 110 and the body 115.

As shown in (a) and (b) of FIG. 9 and (a) and (b) of FIG. 10, a connecting frame 136 may be disposed between the second and third frames 132 and 134. The connecting frame 136 may be spaced apart from a lower surface of the body 115. The connecting frame 136 may be connected to adjacent two frames, for example, the second and third frames 132 and 134.

As shown in FIG. 1 and FIGS. 9 (a) and (b), the first frame 120 may protrude in a direction toward the third side part S3 of the package body 110, and may include a first protrusion 21 exposed to the third side part S3. The second frame 132 may protrude in a direction toward the fourth side part S4 of the package body 110, and a plurality of second protrusions 31 may be exposed to the fourth side part S4. The third frame 134 may protrude in a direction toward the third side part S3 of the package body 110, and may include a third protrusion 32 exposed to the third side part S3, where the third protrusion 32 may include one or plural protrusions. The fourth frame 140 may protrude in a direction toward the fourth side part S4 of the package body 110, and may include a fourth protrusion 41 exposed to the fourth side part S4. The protrusions 21, 31, 32 and 41 may support the package body 110 or the body 115 while being coupled to the package body 110 or the body 115.

The plurality of second protrusions 31 of the second frame 132 may be coupled to the package body 110 and the body 115 to support the second frame 132. The plurality of fourth protrusions 32 of the third frame 134 may be coupled to the package body 110 and the body 115 to support the third frame 134. The second and third frames 132 and 134 may not be exposed to the first and second side parts Si and S2 of the package body 110.

As shown in (a) and (b) of FIG. 9, each of the first to fourth frames 120, 132, 134 and 140 may have an upper surface area larger than a lower surface area. The first and fourth frames 120 and 140 may have the same shape or mutually different shapes. The second and third frames 132 and 134 may have the same shape except for the region of the connecting frame 136. The first frame 120 and the first extension part 123 may be provided on lower portions of them with a step difference structure 125A, and a portion of the step difference structure 125A corresponding to the second and third frames 132 and 134 may have a thin thickness, thereby enhancing the coupling with the body 115. The fourth frame 140 and the second extension part 143 may be provided on lower portions of them with a step difference structure 145A, and a portion of the step difference structure 145A corresponding to the second and third frames 132 and 134 may have a thin thickness, thereby enhancing the coupling with the body 115. The second and third frames 132 and 134 may be provided on circumferences of them with a step difference structure, thereby enhancing the coupling with the body 115.

The first frame 120 may be provided on a lower portion thereof with a first lower recess 125 concave, and the first lower recess 125 may be disposed between a bonding region in which the first light emitting device 151 is disposed and the first extension part 123 in the second direction. The fourth frame 140 may be provided on a lower portion thereof with a second lower recess 145 concave, and the second lower recess 145 may be disposed between a bonding region in which the second light emitting device 153 is disposed and the second extension part 143 in the Y direction. Portions of the first and second recesses 125 and 145 of the first and fourth frames 120 and 140 may overlap a bottom 113 of a cavity 112 in the Z direction. The first and second lower recesses 125 and 145 of the first and fourth frames 120 and 140 may be coupled to a resin part, for example, a portion of the body 115.

The first and second lower recesses 125 and 145 may be provided on the lower surfaces of the first and fourth frames 120 and 140. The first and second lower recesses 125 and 145 may be spaced apart from the first and fourth through-holes TH1 and TH4. The resin part or a portion of the body 115 may be provided to the first and second lower recesses 125 and 145. The resin part may be formed of a material selected from materials having poor adhesion and wettability with the conductive layer 321. When the resin part is formed of the material having poor adhesion and wettability with the conductive layer, the conductive layer provided in the through-hole may be prevented from spreading beyond the through-hole on the resin part or the body. Alternatively, the resin part may be formed of a material selected from materials having low surface tensions with respect to the conductive layer 321. For example, the resin part filled in the first and second lower recesses 125 and 145 may be provided in the process of forming the frames 120, 132, 134 and 140 and the body 115 through an injection process or the like.

The lower surfaces of the first and fourth frames 120 and 140 may have an island shape due to the resin part filled in the lower recesses 125 and 145. The lower surfaces of the second and third frames 132 and 134 may have an island shape due to the resin part filled in the step difference structure of the lower portions. One lower recess or more 125 and 145 may be disposed on each of the frames 120, 132, 134 and 140. Thus, when the resin part is formed of a material having poor adhesion and wettability with the conductive layer 321, or a low surface tension between the resin part and the conductive layer 321, the conductive layer 321 filled in the through-holes TH1, TH2, TH3 and TH4 may be prevented from diffusing into other regions. The material constituting the conductive layer 321 may be selected to have good adhesion with each of the frames 120, 132, 134 and 140. In addition, the material constituting the conductive layer 321 may be selected to have poor adhesion with the resin part and the body 115. Thus, when the light emitting device package is mounted on a circuit board, parts of the conductive layer 321 filled in the through-holes TH1, TH2, TH3 and TH4 may be prevented from making contact with each other to be short circuited, and the amount of the conductive layer 321 may be very easily controlled in the process of disposing the conductive layer 321. The conductive layer 321 may include one selected from the group consisting of Ag, Au, Pt, Sn, Cu, In, and the like, or the alloy thereof. The conductive layer 321 may be solder paste or Ag paste. The conductive layer 321 may include, for example, Sn—Ag—Cu. An alloy layer, an intermetallic compound layer or a compound layer may be formed between the conductive layer 321 and the first and second connecting parts 137 and 138 of the connecting frame 136. The alloy layer, intermetallic compound layer or a compound layer may be at least one selected from the group consisting of AgSn, CuSn, AuSn, and the like. When the conductive layer 321 includes at least one of Ag, Au, Pt, Sn, Cu and In, and the second connecting frame includes at least one of Ag, Au and Pt, the compound layer may be formed through the combining of two materials in the process of providing the conductive layer 321 or in the heat treatment process after the conductive layer 321 is provided.

A concave portion 127 may be provided around the portion of the region of the first frame corresponding to the second frame 132. The concave portion 127 may enhance the bonding force with the body 115. A concave portion 137 may be provided around a portion of the region of the fourth frame 140 corresponding to the third frame 134. The concave portion 137 may enhance the bonding force with the body 115. The end portion of the first frame 120 facing the second frame 132 may have the concave portion 127 and the end portion of the fourth frame 140 facing the third frame 134 may have the concave portion 137. The end portion of the first frame 120 may be an end portion adjacent to the second frame 132 and the concave portion 127 may be concaved in a direction toward the first through-hole TH1 on an end portion of the first frame 120. The end portion of the fourth frame 140 may be an end portion adjacent to the third frame 134 and the concave portion 137 may be concaved in a direction toward the fourth through-hole TH4 on an end portion of the fourth frame 140. Structures like the concave portion may be disposed at outer portions of the second and third frames 132 and 134 corresponding to another frame, but the embodiment is not limited thereto.

The second and third frames 132 and 134 may be interposed between the first and fourth frames 120 and 140. The second frame 132 may be disposed between the first and fourth frames 120 and 140 and may be supported by the body 115. The second frame 132 may be disposed between the first extension part 123 and the fourth frame 140. The third frame 134 may be disposed between the first and fourth frames 120 and 140 and may be supported by the body. The third frame 134 may be disposed between the first frame 120 and the second extension part 143. The second and third frames 132 and 134 may be diagonally spaced apart from each other and the first and fourth frames 120 and 140 may be diagonally spaced apart from each other.

As shown in (a) and (b) of FIG. 9, the second frame 132 may include a step difference structure 135B in a lower portion thereof, where the step difference structure 135B allows the lower surface of the second frame 132 to have an island shape. The step difference structure 135B may be disposed around the second through-hole TH2.

The third frame 134 may include a step difference structure 135A in a lower portion thereof, where the step difference structure 135A allows the lower surface of the third frame 134 to have an island shape. The step difference structure 135A may be disposed around the third through-hole TH3.

As shown in (a) and (b) of FIG. 9, the first and third frames 120 and 134 may be disposed such that the portions corresponding to each other do not have any step difference structures. The second and fourth frames 132 and 140 may be disposed such that the portions corresponding to each other do not have any step difference structures. Since any step difference structures do not formed on the portions of the first and third frames 120 and 134 corresponding to each other, it is possible to secure the rigidity of the frame portion in contact with the body and prevent the frame from being damaged due to a step difference structure when the first and third through-holes TH1 and TH3 are injection formed. Since any step difference structures do not formed on the portions of the second and fourth frames 132 and 140 corresponding to each other, it is possible to secure the rigidity of the frame portion in contact with the body and prevent the frame from being damaged due to a step difference structure when the second and fourth through-holes TH2 and TH4 are injection formed.

Therefore, a region having the thickness of the frames 120, 132, 134 and 140 is secured around each of the through-holes TH1, TH2, TH3 and TH4 by a predetermined distance, so that it is possible to secure the rigidity of the frame portion coupled with the body 115 and reduce the impact transmitted to the frames TH1, TH2, TH3 and TH4 when the through-holes TH1, TH2, TH3 and TH4 are injection formed.

Referring to FIG. 3, the interval T2 between the lower surface of the first extended part 123 of the first frame 120 and the lower surface of the second frame 132 is smaller than the interval T1 between the lower surface of the first frame 120 and the lower surface of the third frame 132 on the lower surfaces of the frames 120, 132, 134 and 140. The interval T2 between the lower surface of the first extension part 123 of the first frame 120 and the lower surface of the second frame 132 may be 400 μm or more, for example, in the range of 400 μm to 600 μm. The interval between the lower surface of the second extended part 143 of the fourth frame 140 and the lower surface of the third frame 134 is smaller than the interval between the lower surface of the first frame 120 and the lower surface of the third frame 132. The interval between the lower surface of the second extension part 143 of the fourth frame 140 and the lower surface of the third frame 134 may be 400 μm or more, for example, in the range of 400 μm to 600 μm. When the light emitting device package is bonded on a circuit board, it is possible to prevent an electrical interference due to the diffusion of solder paste by securing such intervals.

As shown in FIG. 2, the widths of the first and second extension parts 123 and 143 protruding outside the package body 110 may be 100 μm or more, for example, in the range of 100 μm to 400 μm. The widths of the first and second extension parts 123 and 143 may provide a process margin in accordance with injection molding through which the first and second extension parts 123 and 143 may be combined with the body or the package body 110, and protect the body or the first and second side parts S1 and S2 of the package body 110.

Referring to FIGS. 3, 9 and 10, at least one or two or more of the first to fourth frames 120, 132, 134 and 140 may include a through-hole. Each of the first to fourth frames 120, 132, 134 and 140 may include one through-hole or plural through-holes. The first frame 120 may include the first through-hole TH1, the second frame 132 may include the second through-hole TH2, the third frame 134 may include the third through-hole TH3 and the fourth frame 140 may include the fourth through-hole TH4. The first and fourth through-holes TH1 to TH4 may be holes passing through the frames 120, 132, 134 and 140, respectively.

The first to fourth through-holes TH1 to TH4 may not overlap the body 115 in a vertical direction, that is, the Z direction. The first to fourth through-holes TH1 to TH4 may overlap the cavity in the vertical direction, that is, the Z direction.

The first and second through-holes TH1 and TH2 may overlap the first light emitting device 151 in the vertical direction, for example, the Z direction. The interval between the first and second through-holes TH1 and TH2 may be smaller than the length of the first light emitting device 151 in the Y direction. The upper width (or diameter) of each of the first and second through-holes TH1 and TH2 may be smaller than the width of the first light emitting device 151 in the X direction.

The third and fourth through-holes TH3 and TH4 may overlap the second light emitting device 153 in the vertical direction, for example, the Z direction. The interval between the third and fourth through-holes TH3 and TH4 may be smaller than the length of the second light emitting device 153 in the Y direction. The upper width (or diameter) of each of the third and fourth through-holes TH3 and TH4 may be smaller than the width of the second light emitting device 153 in the X direction.

The interval between the first and second through-holes TH1 and TH2 and the interval between the third and fourth through-holes TH3 and TH4 may be smaller than those between the first and third through-holes TH1 and TH3 and between the second and fourth through-holes TH2 and TH4. The intervals may be changed according to the sizes of the first and second light emitting devices 151 and 153 or the interval between the first and second light emitting devices 151 and 153.

<Body 115>

As shown in FIGS. 1 to 4, the body 115 may be connected to the package body 110. The body 115 may be integrally formed of the same material as the package body 110 or may be formed of a separated material. When the body 115 is made of a material different from the package body 110, the package body 110 may adhere or be attached on the body. The package body 110 may provide a cavity 112 having an opened upper portion. The first to fourth frames 120, 132, 134 and 140 may be disposed on the bottom 113 of the cavity 112. The side surface of the cavity 112 may be formed to be perpendicular or inclined to the bottom 113 of the body 115.

The body 115 may be referred to as an insulating member. The body 115 may perform a function of an electrode separation line. The body 115 may be disposed between the first and second frames 120 and 132 and between the third and fourth frames 134 and 140. The body 115 may be disposed between the frames 120, 132, 134 and 140 in the first direction, thereby separating the adjacent first and second frames 120 and 132 and the third and fourth frames 134 and 140 from each other. The body 115 may be disposed in the second direction, so that the body 115 is disposed between the first and third frames 120, 134 and between the second and fourth frames 134 and 140. In the body 115, the portion disposed in the first direction may be connected to the portion disposed in the second direction.

The body 115 may be disposed on the first to fourth frames 120, 132, 134 and 140. The package body 110 may provide an inclined surface disposed on the first to fourth frames 120, 132, 134 and 140. The package body 110 may be provided as side walls with the cavity 112 on the first to fourth frames 120, 132, 134 and 140. The package body 110 may be removed. The body 115 may be integrated with or separated from the package body 110. According to the embodiment, the package body 110 may be provided with a structure having the cavity 112 and with a structure having a flat upper surface without the cavity 112.

For example, the body 115 may be formed of at least one selected from the group consisting of polyphthalamide (PPA), polychloro tri phenyl (PCT), liquid crystal polymer (LCP), polyamide 9T (PA9T), silicone, epoxy molding compound (EMC), silicone molding compound (SMC), ceramic, photo sensitive glass (PSG), sapphire (Al2O3), and the like. In addition, the body 115 may include a high refraction filler such as TiO2, or SiO2. The package body 110 may be formed of the material of the body 115, or may be formed of a material different from the above-mentioned materials.

<Light Emitting Device 151 and 153>

According to the embodiment, the light emitting devices 151 and 153 may include first and second light emitting devices 151 and 153. Referring to FIGS. 4 to 8, the first light emitting device 151 may include first and second bonding parts 51 and 52 and a light emitting part 50 (FIG. 4). The first and second bonding parts 51 and 52 may be disposed under the light emitting part 50 and may be electrodes or/and electrode pads. The first and second bonding parts 51 and 52 may be electrically connected to the first and second frames 120 and 132. The interval between the first and second bonding parts 51 and 52 is smaller than that between the first and second through-holes TH1 and TH2. The first bonding part 51 may overlap the first through-hole TH1 in the third direction and the second bonding part 52 may overlap the second through-hole TH2 in the third direction. The lower surface areas of the first and second bonding parts 51 and 52 may be larger than the upper surface areas of the first and second through-holes TH1 and TH2. The first bonding part 51 may face or overlap the first through-hole TH1 and the first frame 120 in the third direction, and the second bonding part 52 may face or overlap the second through-hole TH2 and the second frame 132 in the third direction. Thus, the first and second bonding parts 51 and 52 of the first light emitting device 151 may be bonded to the conductive layer 321 disposed in the first and second through-holes TH1 and TH2 and may be bonded to the first and second frames 120 and 132. The first light emitting device 151 may be electrically connected to the first and second frames 120 and 132. The first light emitting device 151 may be electrically connected to the conductive layer 321 disposed in the first and second through-holes TH1 and TH2.

The light emitting part 50 of the first and second light emitting devices 151 and 153 may include a semiconductor layer and may emit at least one of blue, green, red, ultraviolet, and infrared ray. The semiconductor layer may include a first conductivity type semiconductor layer, an active layer and a second conductivity type semiconductor layer, and at least one of an n-p junction, a p-n junction, an n-p-n junction and a p-n-p junction. The semiconductor layer may include a compound semiconductor of Group 3 to Group 6 elements. For example, the semiconductor layer may include a compound semiconductor layer of Group 3 and Group 5 elements or a compound semiconductor layer of Group 2 and Group 6 elements. For example, the semiconductor layer may include at least two elements selected from the group consisting of Al, Ga, In, P, As and N. The first bonding part 51 may be connected to one of the first and second conductivity type semiconductor layers and the second bonding part 52 may be connected to the other. The light emitting part 50 may emit the same peak wavelength or emit different peak wavelengths through the light emitting devices 151 and 153. The light emitting part 50 of the first and second light emitting devices 151 and 153 may include a substrate thereon, where the substrate may include a transparent material and may be disposed on the semiconductor layer.

The second light emitting device 153 may include third and fourth bonding parts 53 and 54 and a light emitting part 50 (FIG. 4). The third and fourth bonding parts 53 and 54 may be disposed under the light emitting part and may be electrodes or/and electrode pads. The third and fourth bonding parts 53 and 54 may be electrically connected to the third and fourth frames 134 and 140. The interval between the third and fourth bonding parts 53 and 54 is smaller than that between the third and fourth through-holes TH3 and TH4. The third bonding part 53 may overlap the third through-hole TH3 in the third direction and the fourth bonding part 54 may overlap the fourth through-hole TH4 in the third direction. The lower surface area of each of the third and fourth bonding parts 53 and 54 may be larger than the upper surface area of each of the third and fourth through-holes TH3 and TH4. The third bonding part 53 may face or overlap the third through-hole TH3 and the third frame 134 in the third direction, and the fourth bonding part 54 may face or overlap the fourth through-hole TH4 and the fourth frame 140 in the third direction. Thus, the third and fourth bonding parts 53 and 54 of the second light emitting device 153 may be bonded to the conductive layer 321 disposed in the third and fourth through-holes TH3 and TH4 and may be bonded to the third and fourth frames 134 and 140. The second light emitting device 153 may be electrically connected to the third and fourth frames 134 and 140. The second light emitting device 153 may be electrically connected to the conductive layer 321 disposed in the third and fourth through-holes TH3 and TH4. The third bonding part 53 may be connected to one of the first and second conductivity type semiconductor layers of the light emitting part 50 and the fourth bonding part 54 may be connected to the other.

In the light emitting part 50, the first and second conductivity type semiconductor layers may be formed by using at least one of compound semiconductors of Group 3 to Group 5 or Group 2 to Group 6. The first and second conductivity type semiconductor layers may be formed by using a semiconductor material having a compositional formula of InxAlyGa1-x-yN (0 yrs may be formed by us. For example, the first and second conductivity type semiconductor layers may include at least one selected from the group consisting of GaN, AlN, AlGaN, InGaN, InN, InAlGaN, AlInN, AlGaAs, GaP, GaAs, GaAsP, AlGaInP, and the like. The first conductivity type semiconductor layer may be an N type semiconductor layer doped with an N type dopant such as Si, Ge, Sn, Se, Te, or the like. The second conductivity type semiconductor layer may be a P type semiconductor layer doped with a P type dopant such as Mg, Zn, Ca, Sr, Ba, or the like.

The active layer may be formed by using a compound semiconductor. The active layer may be formed by using at least one of the compound semiconductors of Group 3 to Group 5 or Group 2 to Group 6. When the active layer is implemented in a multi-well structure, the active layer may include a plurality of well layers and a plurality of barrier layers alternately arranged and may be disposed on the semiconductor material having a compositional formula of InxAlyGa1-x-yN (0≤x≤1, 0≤y≤1, 0≤x+y≤1). For example, the active layer may include at least one selected from the group consisting of InGaN/GaN, GaN/AlGaN, AlGaN/AlGaN, InGaN/AlGaN, InGaN/InGaN, AlGaAs/GaAs, InGaAs/GaAs, InGaP/GaP, AlInGaP/InGaP, and InP/GaAs.

The first to fourth bonding parts 51 to 54 may be formed in a single layer or a multi-layer by using at least one selected from the group consisting of Ti, Al, In, Ir, Ta, Pd, Co, Cr, Mg, Zn, Ni, Si, Ge, Ag, Ag alloy, Au, Hf, Pt, Ru, Rh, ZnO, IrOx, RuOx, NiO, RuOx/ITO, Ni/IrOx/Au, and Ni/IrOx/Au/ITO, or the alloy thereof.

Each of the frames 120, 132, 134 and 140 and each of the bonding parts 51 to 54 may be bonded by an intermetallic compound layer. The intermetallic compound layer may include at least one of CuxSny, AgxSny, and AuxSny, where y an inisfies the condition of "0<x<1, y=1−x, x>y".

The bonding parts 51 to 54 of the light emitting devices 151 and 153 may be formed with the intermetallic compound layer between the conductive layer 321 and the frames 120, 132, 134 and 140 in the process of forming material constituting the conductive layer 321 and the conductive layer 321 or in a heat treatment process after providing the conductive layer 321. The conductive layer 321 may include one selected from the group consisting of Ag, Au, Pt, Sn, Cu and the like, or the alloy thereof. However, the embodiment is not limited to above and a material capable of securing a conductive function may be used for the conductive layer 321. For example, the conductive layer 321 may be formed by using conductive paste. The conductive paste may include solder paste, silver paste, or the like, and may be composed of a multi-layer or a single layer composed of a multi-layer or an alloy composed of mutually different materials. For example, the conductive layer 321 may include an SAC (Sn—Ag—Cu) material.

For example, an alloy layer may be formed by combining the material constituting the conductive layer 321 and the metals of the frames 120, 132, 134 and 140. Thus, the conductive layer 321 and the frames 120, 132, 134 and 140 may be coupled to each other to be physically or electrically stable. In addition, the conductive layer 321, the alloy layer and the frame may be coupled to each other to be physically or electrically stable. The alloy layer may include at least one intermetallic compound layer selected from the group consisting of AgSn, CuSn, and AuSn. The intermetallic compound layer may be formed by combining first and second materials, where the first material may be provided from the conductive layer 321 and the second material may be provided from the bonding parts 51 to 54 or the frames 120, 132, 134 and 140.

<Molding Part 180>

As shown in FIGS. 5 to 8, the light emitting package 110 according to an embodiment may include a molding part 180. The molding part 180 may be provided on the light emitting device 151 and 153. The molding part 180 may be disposed on the first to fourth frames 120, 132, 134 and 140. The molding part 180 may be disposed in the cavity 112 provided by the package body 110.

The molding part 180 may include an insulating material. In addition, the molding part 180 may include a wavelength conversion means for receiving light emitted from the light emitting device 151 and 153 and providing wavelength-converted light. For example, the molding part 180 may include at least one selected from the group consisting of phosphor, a quantum dot and the like. The light emitting device 151 and 153 may emit blue, green, red, white, infrared, or ultraviolet light. The phosphor or quantum dot may emit blue, green and red light. The molding part 180 may not be formed.

<Through-Hole TH1, TH2, TH3 and TH4 of Frame>

As shown in FIGS. 2 to 8, the light emitting device package 100 may include a plurality of through-holes TH1, TH2, TH3 and TH4 under the light emitting device 151 and 153. The first frame 120 may include the first through-hole TH1. The second frame 132 may include the second through-hole TH2. The third frame 120 may include the third through-hole TH3. The fourth frame 140 may include the fourth through-hole TH4.

The first to fourth through-holes TH1 to TH4 may be provided in at least one of the frames 120, 132, 134, and 140 as one hole or plural through-holes. The first to fourth through-holes TH1 to TH4 may pass through the frames 120, 132, 134, and 140, respectively. The first to fourth through-holes TH1 to TH4 may pass through the upper and lower surfaces of the frames 120, 132, 134, and 140, respectively.

The first through-hole TH1 may face the lower surface of the first bonding part 51 of the first light emitting device 151, and the second through-hole TH2 may face the lower surface of the second bonding part 52. The third through-hole TH3 may face the lower surface of the third bonding part 53 of the second light emitting device 152, and the fourth through-hole TH4 may face the lower surface of the fourth bonding part 54.

The first and second through-holes TH1 and TH2 may be spaced part from each other. The first and second through-holes TH1 and TH2 may be spaced part from each other under the lower surface of the first light emitting device 151. The first and second through-holes TH1 and TH2 may be disposed in a region overlapping the first light emitting device 151 and may be spaced apart from the body 115. The third and fourth through-holes TH3 and TH4 may be spaced part from each other. The third and fourth through-holes TH3 and TH4 may be spaced part from each other under the lower surface of the second light emitting device 153. The third and fourth through-holes TH3 and TH4 may be disposed in a region overlapping the second light emitting device 153 and may be spaced apart from the body 115.

The depth of each of the through-holes TH1 to TH4 may be the same as the thickness of each of the frames 120, 132, 134 and 140, thereby maintaining the stable strength of each of the frames 120, 132, 134 and 140. For example, the depth of each of the through-holes TH1 to TH4 may be 180 µm or more, for example, in the range of 180 µm to 220 µm.

According to the embodiment, as shown in FIGS. 3 and 4, the width of the upper region of each through-hole TH1 to TH4 in the first and second directions (X and Y) is equal to or smaller than that of the lower width. The widths of the upper regions of the through-holes TH1 to TH4 may be equal to each other in the first and second directions, or the width in the first direction may be larger than that in the second direction. The width of the upper region of each through-hole TH1 to TH4 in the first and second directions may be equal to or smaller than the length of the lower surface of each bonding part 51 to 54 facing the through-holes TH1 to TH4. The upper area of each through-hole TH1 to TH4 may be smaller than the lower area of each bonding part 51 to 54. The through-holes TH1 to TH4 may be covered by the bonding parts 51 to 54, respectively. Each of the through-holes THE TH2, TH3 and TH4 may have an upper portion having a circular or polygonal shape. A shape of each through-hole TH1 to TH4 may be the same shape as or different from the lower surface shape of each bonding part 51 to 54. The lower surfaces of the bonding parts 51 to 54 may have a circular or polygonal shape, but the embodiment is not limited thereto.

The upper surface area of each through-hole TH1 to TH4 may be set to be 50% or more, for example, 50% to 98% of the bottom surface area of each of the bonding parts 51 to 54. In addition, each through-hole TH1 to TH4 and the bonding parts 51 to 54 may have a partially facing region and a non-overlapping region that does not face each other.

The distance from the upper region of each of the through-holes TH1 to TH4 to the side end of each bonding part 51 to 54 in the X direction is 40 µm or more, for example, in the range of 40 µm to 60 µm. When the distance is at least 40 µm, it is possible to secure a process margin for preventing the bonding parts 51 to 54 from being exposed at the lower surface of each of the through-holes TH1 to TH4. When the distance is 60 µm or less, the area of each bonding part 51 to 54 exposed through the through-holes TH1 to TH4 may be secured, and the resistance of each bonding part 51 to 54 exposed through the through-holes TH1 to TH4 may be lowered, so that it is possible to smoothly inject current to the bonding parts 51 to 54 exposed through the through-holes TH1 to TH4.

Each of the through-holes TH1 to TH4 may have a shape in which the width or diameter gradually decreases in the upper direction. As a modified example of the through-holes, as shown in (a) of FIG. 24, the side surface S11 of the through-hole TH may be formed to be curved, and the width or diameter of the through hole TH may gradually decrease toward the upper portion. As shown in (b) of FIG. 24, the side surface S12 of the through-hole TH may be vertically formed, so that the upper and lower portions may be formed to have the same width or diameter. As shown in (c) of FIG. 24, the side surfaces S13 of the through-hole TH may be inclined at mutually different angles, so that the upper width or diameter may be smaller than the lower width or diameter. As shown in (d) of FIG. 24, the side surface S14 of the through-hole TH may include curved surfaces having mutually different curvatures, where a curvature radius of the lower side may be larger than a curvature radius of the upper side. The curved surface may be a curved surface convexed outward from the center of the through hole TH. The through-hole(s) TH (TH1 to TH4) according to the embodiment may be formed on at least some side surfaces, side surfaces facing to each other, or all the side surfaces.

<Conductive Layer 321>

As shown in FIGS. 5 to 8, the light emitting device package 100 according to an embodiment may include a conductive layer 321. The conductive layer 321 may be provided on at least one or all of the plurality of through-holes TH1 to TH4. The conductive layer 321 may be disposed under the bonding parts 51 to 54 of the light emitting device 151 and 153. The width of the conductive layer 321 in the first and second directions X and Y may be smaller than the width of each bonding part 51 to 54.

The conductive layer 321 may be disposed to make direct contact with the lower surface of each of the bonding parts 51 to 54. The conductive layer 321 may be electrically connected to each of the bonding parts 51 to 54. The circumference of the conductive layer 321 may be disposed in each of the frames 120, 132, 134 and 140 and may be connected to each of the frames 120, 132, 134 and 140.

The conductive layer 321 may include one selected from the group consisting of Ag, Au, Pt, Sn, Cu, Zn, In, Bi, Ti, and the like, or the alloy thereof. The conductive layer 321 may be formed by using a material capable of securing the function of electric conductivity. The conductive layer 321 may include solder paste or Ag paste, and may be formed, for example, by mixing a powder particle or a particle with a flux. For example, the conductive layer 321 may include Sn—Ag—Cu. As one example, the conductive layer 321 may be composed of a multi-layer or a single layer composed of a multi-layer or an alloy composed of mutually different materials.

In the light emitting device package 100 according to an embodiment, a power source is connected to the first and second bonding parts 51 and 52 of the first light emitting device 151 through the conductive layer 321 of the first and second through-holes TH1 and TH2, and may be connected to the third and fourth bonding parts 53 and 54 of the second light emitting device 153 through the conductive layer 321 of the third and fourth through-holes TH3 and TH4. When the first and second frames 120 and 132 are conductive, the first and second frames 120 and 132 may be electrically connected to the bonding parts 51 to 54 of the light emitting device 151 and 153. The bonding parts 51 to 54 of the light emitting device 151 and 153 may be electrically connected to the conductive layer 321 and 322 and at least one or all of the frames 120, 132, 134 and 140. Thus, the light emitting devices 151 and 153 may be driven by the driving power supplied through each of the bonding parts 51 to 54. In addition, the light emitted from the light emitting devices 151 and 153 may be radiated upward of the package body 110.

As shown in FIG. 24, the frames 120, 132, 134 or 140 according to an embodiment may include first and second metal layers L1 and L2, where the first metal layer L1 may include Cu, Ni and Ti as a base layer and may be formed in a single layer or multi-layer. The second metal layer L2 may include at least one of an Au layer, a Ni layer and an Ag layer. When the second metal layer L2 includes a Ni layer, since the Ni layer has a small change in thermal expansion, even if the size or disposing position of the package body is changed due to thermal expansion, the position of the light emitting device disposed on an upper portion of the package body may be stably fixed. When the second metal layer L1 includes an Ag layer, the Ag layer may efficiently reflect the light emitted from the light emitting device disposed on the upper portion and improve the luminous intensity.

The conductive layer 321 may include one selected from the group consisting of Ag, Au, Pt, Sn, Cu, Zn, In, Bi, Ti, and the like, or the alloy thereof.

An alloy layer L3 may be disposed between the conductive layer 321 and the frames 120, 132, 134 or 140. The alloy layer L3 may be formed by combining the material constituting the conductive layer 321 and the second material L2 of the frames 120, 132, 134 or 140. The alloy layer L3 may be formed on the surfaces of the through-hole TH of the frames 120, 132, 134 or 140. The alloy layer L3 may include at least one intermetallic compound layer selected from the group consisting of AgSn, CuSn, AuSn and the like. The intermetallic compound layer may be formed by combining first and second materials, where the first material may be provided from the conductive layer 321 and the second material may be provided from the second metal layer L2 or the frames 120, 132, 134 or 140. When the conductive layer 321 includes Sn and the second metal layer L2 includes Ag, the intermetallic compound layer of AgSn may be formed through the combining of Sn and Ag in the process of providing the conductive layer 321 or in the heat treatment process after the conductive layer 321 is provided.

Alternatively, when the conductive layer 321 includes Sn and the second metal layer L2 includes Au, the intermetallic compound layer of AuSn may be formed through the combining of Sn and Au in the process of providing the conductive layer 321 or in the heat treatment process after the conductive layer 321 is provided.

Alternatively, when the conductive layers 321 and 322 includes Sn and the first metal layer L1 of the frames 120, 132, 134 or 140 includes Cu, the intermetallic compound layer of CuSn may be formed through the combining of Cu and Ag in the process of providing the conductive layer 321 or in the heat treatment process after the conductive layer 321 is provided.

Alternatively, when the conductive layer 321 includes Ag and the second metal layer L2 or a layer of the frames 120, 132, 134 or 140 includes Sn, the intermetallic compound layer of AgSn may be formed through the combining of Ag and Sn in the process of providing the conductive layer 321 or in the heat treatment process after the conductive layer 321 is provided.

The intermetallic compound layer described above may have a higher melting point than other bonding materials. In addition, the heat treatment process in which the metal compound layer is formed may be performed at a lower temperature than the melting point of a general bonding material. Therefore, even when the light emitting device package 100 according to an embodiment is bonded to a main substrate through a reflow process, since re-melting phenomenon does not occur, the electrical connection and physical bonding force are not deteriorated.

In addition, according to the light emitting device package 100 and the light emitting device package manufacturing method of an embodiment, the package body 110 does not need to be exposed to a high temperature in the process of manufacturing a light emitting device package. Therefore, according to the embodiment, the package body 110 may be prevented from being exposed to high temperatures to be damaged or discolored. Accordingly, the selection range for the material constituting the body 115 may be widened. According to an embodiment, the body 115 may be provided by using a relatively inexpensive resin material as well as an expensive material such as ceramic.

Referring to FIG. 3 and (a) and (b) of FIG. 9, in the lower surface region of the first and second frames 120 and 132, the interval between the first and second through-holes TH1 and TH2 may be 100 μm or more, for example, in the range of 100 μm to 150 μm. In the lower surface region of the third and fourth frames 134 and 140, the interval between the third and fourth through-holes TH3 and TH4 may be 100 μm or more, for example, in the range of 100 μm to 150 μm. The intervals between the through holes TH1 to TH4 may be the minimum distances required to prevent the electrodes from being electrically shorted when the light emitting device package 100 is mounted on a circuit board or a sub-mount.

The minimum distance (D5 of FIG. 3) between the central portion of each through-hole TH1 to TH5 and an end of the frame 120, 132, 134 or 140 may be 80 μm or more, for example, in the range of 80 μm to 120 μm, where the frames may be provided at the same thickness without any step difference structures within the distance D5. Since the through-holes TH1 to TH4 have the thickness of the frame and are spaced apart from each other by the distance D5, the shapes of the through-holes TH1 to TH5 may be maintained and the damage due to the body molding may be prevented. The distance D5 may be equal to or smaller than the upper widths of the through-holes TH1 to TH4.

<Recess R1 and R2 of Body>

As shown in FIGS. 1 to 4, the light emitting device package 100 according to an embodiment may include recesses R1 and R2. The recesses R1 and R2 may be provided to an upper portion of the body 115. The plurality of recesses R1 and R2 may be spaced apart from each other. The recesses R1 and R2 include first and second recesses R1 and R2. The lengths of the first and second recesses R1 and R2 in the first direction X may be larger than the width in the second direction Y. The first recess R1 may be disposed between the first and second frames 120 and 132, and the second recess R2 may be disposed between the third and fourth frames 134 and 140. The first recess R1 may be disposed between the first and second through-holes TH1 and TH2, and the second recess R2 may be disposed between the third and fourth through-holes TH3 and TH4.

A virtual line having the shortest length between the first and second through-holes TH1 and TH2 may be disposed and the first recess R1 may extend in the direction perpendicular to the virtual line. The length of the first recess R1 may be larger than the width of the light emitting device 151 and 153 in the direction in which the first recess R1 extends.

A virtual line having the shortest length between the third and fourth through-holes TH3 and TH4 may be disposed and the second recess R2 may extend in the direction perpendicular to the virtual line. The length of the second recess R2 may be larger than the width of the light emitting devices 151 and 153 in the direction in which the second recess R2 extends.

The length of the first recess R1 in the first direction may be larger than the widths of the first and second through-holes TH1 and TH2 in the first direction, and may be equal to or longer than the length of the first light emitting device 151 in the first direction. The length of the second recess R2 in the first direction may be larger than the widths of the third and fourth through-holes TH3 and TH4 in the first direction, and may be equal to or longer than the length of the second light emitting device 153 in the first direction. The widths of the first and second recesses R1 and R2 in the second direction are set to be 30% or more, for example, in the range of 30% to 70% of the interval between the first and second frames 120 and 132, so that the rigidity of the body 115 disposed between the first and second frames 120 and 132 may be prevented from being deteriorated and the adhesion force may be prevented from being decreased.

The recesses R1 and R2 may be recessed from the upper surface of the body 115 in a direction toward the lower surface. The depths of the first and second recesses R1 and R2 may be smaller than the depths of the through-holes TH1 to TH4. The depths of the first and second recesses R1 and R2 are set to be 40% or more, for example, in the range of 40% to 60% of the thickness of the body 115. If the depths of the first and second recesses R1 and R2 are smaller than the range, the amount of the first resin 160 and 162 may be reduced, so that the improvement of the supporting force of the light emitting device 151 and 153 may be insignificant.

The depths of the recesses R1 and R2 may be determined in consideration of the adhesion strength of the first resin 160 and 162. In addition, the depths of the recesses R1 and R2 may be determined by taking into consideration the stable strength of the body 115 and/or preventing the light emitting device package 100 from being cracked due to the heat emitted from the light emitting device 151 and 153.

The recesses 125 and 145 may be disposed in one or more than one under each light emitting device 151 and 153. The recesses R1 and R2 may overlap each light emitting device 151 and 153 in the Z direction. For example, the depths of the recesses R1 and R2 are the result of taking into consideration the injection process thickness capable of providing crack free to the body 115. The ratio between the depths of the recesses R1 and R2 and the through-holes TH1 to TH4 may be in the range of 2 to 10. For example, when the depths of the through-holes TH1 to TH4 are 200 ηm, the depths of the recesses R1 and R2 may be in the range of 20 μm to 100 μm.

The recesses R1 and R2 may be provided in the lower portion of the light emitting device 151 and 153 with a suitable space in which an under-fill process is performed. In this case, the under-fill process may be a process of mounting the light emitting device 151 and 153 on the body 115 and then disposing the first resin 160 and 162 on a lower portion of the light emitting device 151 and 153, and a process of disposing the light emitting device 151 and 153 after disposing the first resin 160 and 162 in the recesses R1 and R2 for the purpose of mounting the light emitting device 151 and 153 through the first resin 160 and 162 in the process of mounting the light emitting device 151 and 153 on the body 115. The recesses R1 and R2 may be provided at a predetermined depth or more sufficient to provide the first resin 160 and 162 between the lower surface of the light emitting device 151 and 153 and the upper surface of the body 115. In addition, the recesses R1 and R2 may be provided at a predetermined depth to provide a stable strength to the body 115. For example, the depths of the recesses R1 and R2 may be 40 μm or more, for example, in the range of 40 μm to 60 μm. The widths of the recesses R1 and R2 in the second direction may be at least 140 μm, for example, in the range of 140 μm to 160 μm. The lengths of the recesses R1 and R2 in the first direction is longer or shorter than that of the light emitting device 151 and 153 in the Y direction, so that it is possible to guide the forming of the first resin 160 and 162 and enhance the adhesion strength in the first direction.

<First Resin 160 and 162>

The light emitting device package 100 according to an embodiment may include the first resin 160 and 162. The first resin 160 and 162 may be disposed between the body 115 and the light emitting device 151 and 153. The first resin 160 and 162 may be disposed between the lower surface of the body 115 and the lower surface of the light emitting device 151 and 153. The first resin 160 and 162 may overlap the light emitting device 151 and 153 in the vertical direction that is the Z-axis direction. The first resin 160 and 162 may adhere to the light emitting device 151 and 153 and the body 115. The first resin 160 and 162 may be disposed between the bonding parts 51 to 54 of the light emitting device 151 and 153. The first resin 160 disposed in the first recess R1 may be disposed between the first and second bonding parts 51 and 52 and may make contact with the lower surface of the first light emitting device 151 and the first and second bonding parts 51 and 52. The second resin 162 disposed in the second recess R2 may be disposed between the lower surface of the second light emitting device and the third and fourth bonding parts 53 and 54 and may make contact with the third and fourth bonding parts 53 and 54.

The first resin 160 and 162 may be disposed in the recesses R1 and R2, respectively. The first resin 160 and 162 may provide a stable fixing force between the light emitting device 151 and 153 and the package body 110 and/or the body 115. The first resin 160 and 162 may provide a stable fixing force between the light emitting device 151 and 153 and the body 115. For example, the first resin 160 and 162 may be disposed to make direct contact with the upper surface of the body 115. In addition, the first resin 160 and 162 may be disposed to make direct contact with the lower surface of the body 115.

For example, the first resin 160 and 162 may include at least one of an epoxy-based material, a silicone-based material, and a hybrid material including an epoxy-based material and a silicon-based material. In addition, for example, when the first resin 160 and 162 includes a reflection function, the first resin may include metal oxide such as white silicone. The first resin 160 and 162 may be formed of a material different from the molding part, or may contain a different kind of an impurity (for example, metal oxide) from a kind of an impurity (for example, phosphor) that may be added to the molding part. The first resin 160 and 162 may be adhesive.

The first resin 160 and 162 may provide a light diffusion function between the light emitting device 151 and 153 and the body 115 when light is emitted to the lower surface of the light emitting device 151 and 153. When the light is emitted from the light emitting devices 151 and 153 to the lower surfaces of the light emitting device 151 and 153, the first resin 160 and 162 may provide a light diffusing function to improve light extraction efficiency of the light emitting device package 100. In addition, the first resin 160 and 162 may reflect the light emitted from the light emitting device 151 and 153. When the first resin 160 or 162 includes a reflection function, the first resin 160 and 162 may be composed of a material including a metal oxide such as TiO2, silicone or Al2O3, or an impurity.

<Inner Wall Part 117>

The light emitting device package 100 according to an embodiment may include an inner wall part 117 on the body 115. The inner wall part 117 may be disposed between the light emitting devices 151 and 153 in the second direction. The maximum length D2 of the inner wall part 117 in the second direction may be disposed to be longer than the bottom length of the cavity 112. The width D1 of the inner wall part 117 in the first direction may be 200 µm or more, for example in the range of 200 µm to 400 µm. When the width D1 of the inner wall part 117 is larger than that in the above-mentioned range, the space in which the light emitting devices 151 and 153 may be reduced so that the device size is reduced. When the width D1 is smaller than that in the above-mentioned range, the light reflection efficiency may be deteriorated.

For example, the thickness (H1 of FIG. 6) of the inner wall part 117 may be larger than that of the light emitting device 151 and 153. The height of the upper surface of the inner wall part 171 may be higher than that of the upper surface of the light emitting device 151 and 153. The thickness H1 of the inner wall part 117 may be 150 µm or more from the upper surface of the body 115, for example, in the range of 150 µm to 250 µm. If the thickness H1 is smaller than that in the above-mentioned range, the light reflection efficiency may be deteriorated. If the thickness H1 is larger than that in the above-mentioned range, the thickness may affect the light-directed distribution.

The inner wall part 117 may have a shape of a straight line lengthened in one direction and may include an oblique shape. The side end surface of the inner wall part 117 may have a hemispherical shape, a semi-elliptical shape, or a polygonal shape.

The inner wall part 117 may be disposed between the first and second light emitting devices 151 and 153. Since the first and second light emitting devices 151 and 153 are blocked by the inner wall part 117, the reflection efficiency of light emitted from the first and second light emitting devices 151 and 153 may be improved. The inner wall part 117 may separate the space in which the first and second frames 120 and 132 are disposed and the space in which the third and fourth frames 134 and 140 are disposed from each other. Both ends of the inner wall part 117 may be in contact with the package body 110 and may be formed integrally with the package body 110. The inner wall part 117 may be formed of the same material as the body 115 and/or the package body 110. The lower surface of the inner wall part 117 may be integrally formed with or may be separately attached to the body 110. The inner wall part 117 may be formed of an insulating material as an intermediate wall.

The first and second frames 120 and 132 may be spaced apart from each other at one side of the inner wall part 117, and the third and fourth frames 134 and 140 may be spaced apart from each other at the other side of the inner wall part 117.

The inner wall part 117 may be formed of at least one selected from the group consisting of polyphthalamide (PPA), polychloro tri phenyl (PCT), liquid crystal polymer (LCP), polyamide 9T (PA9T), silicone, epoxy molding compound (EMC), silicone molding compound (SMC), ceramic, photo sensitive glass (PSG), sapphire (Al2O3), and the like. In addition, the inner wall part 117 may include a high refraction filler such as TiO2, or SiO2. The inner wall part 117 may be formed of the material of the body 115, or may be formed of a material different from the above-mentioned materials.

<Connecting Frame 136>

The light emitting device package 100 according to an embodiment may include a connecting frame 136. The connecting frame 136 may be connected between two frames adjacent to each other. As shown in (a) and (b) of FIG. 9, the connecting frame 136 may be connected to the second and third frames 132 and 134, or may be integrally formed with the second and third frames 132 and 134.

The connecting frame 136 may include at least one of metal, solder paste and Ag paste. When the connecting frame 136 is formed of metal, the connecting frame 136 may include metal constituting the second and third frames 132 and 134. The connecting frame 136 may be formed of metal constituting the second and third frames 132 and 134 in a single layer or a multi-layer.

The connecting frame 136 may be disposed in the body 115. The connecting frame 136 may be disposed between the body 115 and the inner wall part 117. The connecting frame 136 may connect the second and third frames 132 and 134 to each other.

The connecting frame 136 may be thinner than the thicknesses of the first to fourth frames 120, 132, 134 and 140. The thicknesses of the first to fourth frames 120, 132, 134 and 140 may be a straight line distance between the bottom surface of the cavity 112 or the upper surface of the body 115 and the lower surface of the body 115. The upper surface of the connecting frame 136 may be coplanar with the upper surfaces of the second and third frames 132 and 134. As another example, the upper surface of the connecting frame 136 may be disposed lower than the bottom of the cavity, and the lower surface of the connecting frame 136 may be coplanar with the lower surfaces of the second and third frames 132 and 134. The connecting frame 136 may extend linearly between the second and third frames 132 and 134, or may be formed in a curved or angled shape.

The width of the connecting frame 136, which is a length in the direction orthogonal to the length, may be shorter than the length of the connecting frame 136. The width of the connecting frame 136 may vary depending on the supply voltage and for example, may be at least 120 µm. For example, the width of the connecting frame 136 may be in the range of 120 µm to 300 µm or 150 µm to 250 µm. The connecting frame 136 may extend in the direction spaced apart from the first direction by a predetermined angle, for example, in the range of 30 to 70 degrees. The length D11 (of FIG. 3) of the connecting frame, that is, the interval between the second and third frames 132 and 134 may be at least 400 µm, for example, in the range of 400 µm to 600 µm. The width of the connecting frame 136, which is a width in the direction from the first frame 120 toward the fourth frame 140, may be at least 150 µm, for example, in the range of 150 µm to 300 µm. The length of the connecting frame 136 may vary depending on the size of the package and the size of each frame, and the width may be arranged within a range in which there is no electrical interference between the first and fourth frames 120 and 140 adjacent to each other.

In the light emitting device package 100 according to an embodiment, an optical lens or an optical member may be disposed on the upper portion thereof. The optical lens may change the directivity angle of the incident light, and the optical member may include a light guide plate that diffuses the light to provide a surface light source, or a prism sheet on the light guide plate.

The light emitting device package 100 according to an embodiment may be connected in series to a plurality of light emitting devices 151 and 153. As another example, the light emitting devices 151 and 153 may be connected in parallel to each other.

Referring to FIG. 2, the power source of the first polarity is connected to the first frame 120 and the first extension part 123, the power source of the second polarity is connected to the fourth frame 140 and the second extension part 143, so that the first and second light emitting devices 151 and 153 may be connected in series through the connecting frame 136. The first frame 120 is connected to the first extension part 123 and the first light emitting device 151 connects the first frame 120 and the second frame 132, The third frame 134 connects the second frame 132 and the third frame 134 and the second light emitting device 153 connects the third frame 134 and the fourth frame 140 The fourth frame 140 may be connected to the second extension part 143. Thus, the first and second light emitting devices 151 and 153 may be connected between the first and fourth frames 120 and 140. The light emitting device package may serve as a high-voltage package by connecting the light emitting devices 151 and 153 to each other at the inside thereof.

Since the connecting frame 136 extends in the opposite polarity direction between the first and second light emitting devices 151 and 153, the connecting frame 136 may be bonded to the circuit board while reducing the areas of the second and third frames 132 and 134, and the sizes of the first and fourth frames 120 and 140 to which power is supplied may be increased.

According to an embodiment, the luminous intensity of the light emitting device package may be improved. The inner wall part 117 may be disposed between the first and second light emitting devices 151 and 153 to reflect the incident light and control the light directivity distribution. Thus, since the light emitting device package allows the light directing angle distribution to be uniformed in the space in which the light emitting devices 151 and 153 are disposed, the luminous intensity distribution and the luminance distribution may be improved.

According to the embodiment, the supporting strength of the light emitting devices 151 and 153 may be improved. As shown in FIGS. 2 and 4, the first recess R1 is provided between the first and second frames 120 and 132 and the second recess R2 is provided between the third and fourth frames 134 and 140, such that the light emitting devices 151 and 153 may be bonded with the first resin 160 and 162. The first resin 160 and 162 may support the light emitting elements 151 and 153, respectively, thereby supporting the moving of the light emitting devices 151 and 153 due to external factors.

An (a) and (b) of FIG. 10 are modifications of (a) and (b) of FIG. 9, where the first light emitting device 151 is disposed on the first and third frames 120 and 134, and the second light emitting device 153 is disposed on the second and fourth frames 132 and 140. That is, the light emitting devices 151 and 153 may be connected to each other while being arranged on the two frames 120 and 134 (132 and 140) in the first direction and may be spaced apart from each other in the second direction. The second and third frames 132 and 134 may be connected to each other through the connecting frame 136.

The light emitting device package according to an embodiment may be selectively applied to a modification described below or another embodiment, and the following modified examples and embodiments will be described focused on parts different from the first embodiment.

FIG. 11 is a view illustrating the first modification example of the semiconductor device package of FIG. 5. The light emitting device package of FIG. 11 includes the second resin 164. The second resin 164 may be disposed on the circumference of the light emitting device 151 and 153. The second resin 164 may be disposed on the first to fourth frames 120, 132, 134 and 140. The second resin 164 may be in contact with the lower surface of the light emitting device 151 and 153. A portion of the second resin 164 may be in contact with the lower portion of the side surface of the light emitting device 151 and 153. The second resin 164 may reflect the light emitted from the light emitting device 151 and 153 in the side direction.

For example, the second resin 164 may include at least one of an epoxy-based material, a silicone-based material, and a hybrid material including an epoxy-based material and a silicon-based material. In addition, the second resin 164 may be a reflective part that reflects the light emitted from the light emitting device 151 and 153, and for example, may be resin including a reflective material such as $TiO_2$ or the like, or may include white silicone. The second resin 164 may be formed of a material different from the molding part, or may contain a different kind of an impurity (for example, metal oxide) from a kind of an impurity (for example, phosphor) that may be added to the molding part.

FIG. 12 is a view illustrating a second modification example of the semiconductor device package of FIG. 5, where, referring to FIGS. 11 and 12, the light emitting device package includes upper recesses R5 and R6. The upper recesses R5 and R6 may be disposed on each frame, for example, the third and fourth frames 134 and 140. The upper recesses R5 and R6 may be recessed from the upper surface of each frame in a direction toward the lower surface and may be disposed along the circumference of each of the light emitting devices 151 and 153. The second resin 166 may be disposed in the upper recesses R5 and R6 and may be disposed from the upper recesses R5 and R6 to the region between the light emitting devices 151 and 153. The depths of the upper recesses R5 and R6 may be in the range of 40% to 60% of the thickness of the frames 121, 132, 134 and 140, and the width may be formed in a range capable of preventing and reducing the strength of the frames 121, 132. The upper recesses R5 and R6 may be disposed in the region that does not overlap the lower recesses 125 and 145 and the step difference structure in the third direction. The upper recesses R5 and R6 may overlap the light emitting devices 151 and 153 in the third direction so that the second resin 166 may make contact with the light emitting devices 151 and 153.

FIG. 13 is a view illustrating a third modification example of the semiconductor device package of FIG. 5. Referring to FIGS. 11 and 13, the light emitting device package includes upper recesses R7 and R8. The upper recesses R7 and R8 may be formed along an upper edge of each frame. The upper recesses R7 and R8 may be disposed in the region that does not overlap the lower recesses and the step difference structure in the third direction. The upper recesses R7 and R8 may be spaced apart from the light emitting devices 151 and 153. The second resin 164 may be disposed in the upper recesses R7 and R8 and the second resin 164 may be disposed on the bottom of the cavity 112. A part of the second resin 164 may make contact with the lower surface of the light emitting devices 151 or 153. A part of the second resin 164 may make contact with the lower side surface of the light emitting devices.

In FIGS. 12 and 13, the material of the second resin 164 and 166 may be a reflecting part that reflects light emitted from the light emitting devices 151 and 153, and for example, may be resin containing a reflective material such as TiO2, or may include white silicone.

FIG. 14 is a view illustrating a fourth modification example of the semiconductor device package of FIG. 5.

Referring to FIG. 14, the light emitting device package may include a through-hole TH0 in the body 115 disposed under the light emitting devices 151 and 153. The through-hole TH0 may be a hole penetrating from the upper surface to the lower surface of the body 115. The through-hole TH0 may be disposed between two adjacent through-holes TH3 and TH4. The width of the through-hole TH0 in the first direction may be smaller than the width of the body 115, and the length in the second direction may be smaller or larger than the lengths of the light emitting elements 151 and 153 in the second direction. A part of the molding part 180 may be disposed in the through-hole TH0, or a part of the first resin 162 shown in FIGS. 13 and 14 may be disposed in the through-hole TH0. When the through-hole TH0 is formed, the through-hole TH0 may be filled with the molding part 180 after attaching a sheet tightly closed to the lower portion or may be molded with the first resin 162. The through-hole TH0 may have the same upper width or diameter as the lower width or diameter. The through-hole TH0 may have a shape through which a part of the first and second recesses R1 and R2 described above, or the entire region of which is penetrated.

FIG. 15 is a view illustrating a modification example of the bonding part of the light emitting devices 150 and 153 in the semiconductor device package according to an embodiment. Each of the bonding parts 53A and 54A of the light emitting devices 150 and 153 shown in FIGS. 1 to 8 may have an area of 10% or more of the bottom area of the light emitting device 150 and correspond to each of the through-holes TH3 and TH4. In the light emitting device TH0 shown in FIG. 15, each bonding part 53A and 54A may be arranged to have an area less than 10% of the bottom surface area of the light emitting device 150. For example, the maximum width of each bonding part 53A and 54A may be smaller than the upper surface areas of the through-holes TH3 and TH4. Thus, the bonding portions 53A and 54A of the light emitting device 150 may be inserted into the through-holes TH3 and TH4. The lower surfaces of the bonding portions 53A and 54A of the light emitting device 150 may be disposed at lower positions than those of the upper surfaces of the body or the frames 130 and 140. The bonding parts 53A and 54A of the light emitting device 150 may be disposed in the through-holes TH3 and TH4 and may be coupled to the conductive layer 321 disposed in the through-holes TH3 and TH4. In this case, the conductive layer 321 may make contact with the circumference of the bonding parts 53A and 54A of the light emitting device 150, thereby improving the adhesion strength with the light emitting device 150. In this case, power may be supplied to each bonding part of the light emitting device 150 through the conductive layer 321.

The bonding parts 53A and 54A of the light emitting device 150 may be formed with the intermetallic compound layer between the conductive layer 321 and the frames 130 and 140 in the process of forming material constituting the conductive layer 321 and the conductive layer 321 or in a heat treatment process after providing the conductive layer 321. The conductive layer 321 may include one selected from the group consisting of Ag, Au, Pt, Sn, Cu, Zn, In, Bi, Ti, and the like, or the alloy thereof. However, the embodiment is not limited to the above and a material capable of securing the conductive function as the conductive layer 321. As an example, the conductive layer 321 may formed by using conductive paste. The conductive paste may include solder paste, silver paste, or the like, and may be composed of a multi-layer or a single layer composed of a multi-layer or an alloy composed of mutually different materials. For example, the conductive layer 321 may include Sn—Ag—Cu (SAC).

For example, an alloy layer may be formed by combining the material constituting the conductive layer 321 and the metal of the frame. Thus, the conductive layer 321 and the frame may be coupled to each other to be physically or electrically stable. The conductive layer 321, the alloy layer and the frame may be coupled to each other to be physically or electrically stable. The alloy layer may include at least one intermetallic compound layer selected from the group consisting of AgSn, CuSn, and AuSn. The intermetallic compound layer may be formed by combining first and second materials, where the first material may be provided from the conductive layer 321 and the second material may be provided from the bonding parts or the frames.

Second Embodiment

FIGS. 16 to 20 are views illustrating the second embodiment, where the same parts as those of the first embodiment may include the description and the configuration of the first embodiment, and the parts different from the first embodiment will be described below.

FIG. 16 is a plan view illustrating a semiconductor device package according to a second embodiment. FIG. 17 is a bottom plan view illustrating the semiconductor device package of FIG. 16. FIG. 18 is a sectional view taken along line E-E of the semiconductor device package of FIG. 16. FIG. 19 is a view illustrating an example in which a conductive layer is disposed in a through-hole of a connecting frame of the semiconductor device package of FIG. 18. FIG. 20 is a plan view illustrating a frame of the semiconductor device package of FIG. 16.

Referring to FIGS. 16 to 20, the light emitting device package includes a connecting frame 136A having a fifth through-hole TH5. The fifth through-hole TH5 of the connecting frame 136A may have a height equal to or lower than those of the other through-holes. The fifth through-hole TH5 may pass through the upper and lower surfaces of the connecting frame 136A. The width direction may be orthogonal to the direction in which the connecting frame 136A extends.

The fifth through-hole TH5 may separate the connecting frame 136A into the first and second connecting parts 137 and 138. The connecting frame 136A may include the first connecting part 137, a material disposed in the fifth through-hole TH5, and the second connecting part 138. The fifth through-hole TH5 may extend to the body 115 disposed on a lower portion of the connecting frame 136A or may be exposed to the lower surface of the body. The fifth through-hole TH5 may have a shape, the upper width of which is larger than the bottom width thereof, or may have one of the shapes shown in (a) to (d) of FIG. 24. In this case, the first connecting part 137 may be included in the second frame 132 and the second connecting part 138 may be included in the third frame 134.

The width of the fifth through-hole TH5, which is larger than the width of the connecting frame 136A, may be 200 μm or more, for example, in the range of 200 μm to 400 μm. The lower width of the fifth through-hole TH5 may be smaller than the minimum separation distance between the first and second connecting parts 137 and 138.

As shown in FIG. 20, since the connecting frame 136A is separated into the first and second connecting parts 137 and 138 by the fifth through-hole TH5, the first light emitting device 151 may be electrically connected to the first and second frames 120 and 132, and the second light emitting device 153 may be connected to the third and fourth frames 134 and 140. In this case, the first and second light emitting devices 151 and 153 may be connected in parallel to each other or individually driven. As shown in FIG. 18, the through-hole TH5 may be an empty area or may be filled with an insulating resin material.

As shown in FIG. 19, a conductive layer 191 may be disposed in the fifth through-hole TH5. The conductive layer 191 may include one selected from the group consisting of Ag, Au, Pt, Sn, Cu, Zn, In, Bi, Ti, and the like, or the alloy thereof. The conductive layer 191 may connect the first and second connecting parts 137 and 138 of the connecting frame 136A to each other. The conductive layer 191 may be solder paste or Ag paste. The conductive layer 191 may include, for example, Sn—Ag—Cu. Since the conductive layer 191 connects the first and second connecting parts 137 and 138 to each other, the second and third frames 132 and 134 may be connected to each other. The first light emitting device 151 may be connected to the first and second frames 120 and 132, the second light emitting device 153 may be connected to the third and fourth frames 134 and 140, and the connecting frame 136A may be connected to the second and third frames 132 and 134. Thus, the first and second light emitting devices 151 and 153 may be connected in series to each other.

The connecting frame 136A according to an embodiment may include at least one of Cu, Ni, Ti, Au, In, Sn, and Ag and may be formed in a single layer or a multi-layer. The conductive layer 191 may include one selected from the group consisting of Ag, Au, Pt, Sn, Cu, Zn, In, Bi, Ti, and the like, or the alloy thereof.

An alloy layer may be formed between the conductive layer 191 and the connecting frame 136A. The alloy layer may be formed by combining the material constituting the conductive layer 191 and the metal layer of the connecting frame 136A. The alloy layer may be formed on the surface of the through-hole TH5 of the connecting frame 136A. The alloy layer may include at least one intermetallic compound layer selected from the group consisting of AgSn, CuSn, AuSn, and the like. The intermetallic compound layer may be formed by combining first and second materials, where the first material may be provided from the conductive layer 191 and the second material may be provided from the metal layer or the base layer of the connecting frame 136A. The alloy layer may include at least one intermetallic compound layer selected from the group consisting of AgSn, CuSn, AuSn, and the like. The intermetallic compound layer may be formed by combining first and second materials, where the first material may be provided from the conductive layer 191 and the second material may be provided from the bonding parts or the frame.

The intermetallic compound layer described above may have a higher melting point than other bonding materials. In addition, the heat treatment process in which the metal compound layer is formed may be performed at a lower temperature than the melting point of a general bonding material. Therefore, even when the light emitting device package 100 according to an embodiment is bonded to a main substrate through a reflow process, since re-melting phenomenon does not occur, the electrical connection and physical bonding force are not deteriorated.

In addition, according to the light emitting device package 100 and the light emitting device package manufacturing method of an embodiment, the package body 110 does not need to be exposed to a high temperature in the process of manufacturing a light emitting device package. Therefore, according to the embodiment, the package body 110 may be prevented from being exposed to high temperatures to be damaged or discolored. Accordingly, the selection range for the material constituting the body 115 may be widened. According to an embodiment, the body 115 may be provided by using a relatively inexpensive resin material as well as an expensive material such as ceramic.

Depending on existence of the conductive layer 191 disposed in the fifth through-hole TH5, the light emitting device package may drive the light emitting devices or may drive the plurality of light emitting devices. That is, since the driving voltage may be changed according to the number of connected light emitting devices, it is possible to provide a package capable of switching the driving voltage according to the purpose of use. That is, when the drive voltage of the individual light emitting device is 3 V, a common package may be provided to switch to 3 V or 6 V. A package, which has light emitting devices, the number of which is two or more times the number of frames and the number of connecting frames, may be provided so that it is possible to switch to a higher voltage.

Third Embodiment

FIGS. 21 to 23 are views illustrating the second embodiment, where the same parts as those of the first embodiment may include the description and the configuration of the first embodiment, and the parts different from the first embodiment will be described below.

FIG. 21 is a bottom plan view illustrating a semiconductor device package according to a third embodiment. FIG. 22 is a side sectional view illustrating the semiconductor device package of FIG. 21. FIG. 23 is a plan view illustrating a frame of the semiconductor device package of FIG. 21.

Referring to FIGS. 21 to 23, the light emitting device package may include a connecting recess 119. The connecting recess 119 may be disposed between the second and third frames 132 and 134. The connecting recess 119 is connected to the second and third frames 132 and 134 and may extend from the second frame 132 in a direction toward the third frame 134. The connecting recess 119 may have a depth smaller than the thickness of the body 115 and may be disposed from the lower surface of the body 115 in the range of 40% to 60% of the thickness of the body 115. The extending direction of the connecting recess 119 may be a diagonal direction, that is, the extension direction of the virtual line having the shortest length between the second and third frames 132 and 134.

The connecting recess 119 may be spaced apart from the upper surface of the body 115 by a predetermined distance. The length D11 of the connecting recess 119 may be equal to or less than the interval between the second and third frames 132 and 134. The connecting recess 119 may have an upper width that is narrower than or equal to the lower width, and may include one of (a) and (b) of FIG. 24.

The connecting recess 119 may be an empty space or filled with an insulating resin material, or may be provided therein with a conductive layer 192. When the connecting recess 119 is empty, since the second and third frames 132 and 134 are not connected to each other, the light emitting devices 151 and 153 may be connected in parallel to each other or individually driven. When the conductive layer 192 is disposed in the connecting recess 119, the second and third frame 132 and 134 may be connected to each other, and the first and second light emitting devices 151 and 153 may be connected to each other. Depending on whether the conductive layer 192 is disposed in the connecting recess 119, the driving voltage of the light emitting device package may be supplied, for example, at a driving voltage of n times. In this case, "n" is the number of connected light emitting devices.

The conductive layer 192 may include one selected from the group consisting of Ag, Au, Pt, Sn, Cu, In, and the like, or the alloy thereof. The conductive layer 192 may connect the first and second frames 132 and 134 to each other. The conductive layer 192 may be solder paste or Ag paste. The conductive layer 192 may include, for example, Sn—Ag—Cu. Since the conductive layer 192 connects the second and third connecting parts 132 and 134 to each other, the second and third frames 132 and 134 may be connected to each other.

The second and third frames 132 and 134 according to an embodiment may include at least one of Cu, Ni, Ti, Au, In, Sn, and Ag and may be formed in a single layer or a multi-layer. The conductive layer 192 may include one selected from the group consisting of Ag, Au, Pt, Sn, Cu, Zn, In, Bi, Ti, and the like, or the alloy thereof. An alloy layer may be disposed between the conductive layer 192 and each of the second and third frames 132 and 134. The alloy layer may be formed by combining the material constituting the conductive layer 192 and each metal layer of the second and third frame 132 and 134. The alloy layer may be disposed on the surface of the second and third frames 132 and 134. The alloy layer may include at least one intermetallic compound layer selected from the group consisting of AgSn, CuSn, AuSn, and the like. The intermetallic compound layer may be formed by combining first and second materials, where the first material may be provided from the conductive layer 192 and the second material may be provided from the metal layer or the base layers of the second and third frames 132 and 134. The alloy layer may include at least one intermetallic compound layer selected from the group consisting of AgSn, CuSn, AuSn, and the like. The intermetallic compound layer may be formed by combining first and second materials, where the first material may be provided from the conductive layer 192 and the second material may be provided from the bonding part or the frame.

The intermetallic compound layer described above may have a higher melting point than other bonding materials. In addition, the heat treatment process in which the metal compound layer is formed may be performed at a lower temperature than the melting point of a general bonding material. Therefore, even when the light emitting device package 100 according to an embodiment is bonded to a main substrate through a reflow process, since re-melting phenomenon does not occur, the electrical connection and physical bonding force are not deteriorated.

In addition, As described above, according to the semiconductor device package and the method of manufacturing a semiconductor device package of an embodiment, the package body 110 does not need to be exposed to a high temperature in the process of manufacturing a light emitting device package. Therefore, according to the embodiment, the package body may be prevented from being exposed to high temperatures to be damaged or discolored. Accordingly, the selection range for the material constituting the body 115 may be widened. According to an embodiment, the body may be provided by using a relatively inexpensive resin material as well as an expensive material such as ceramic.

Depending on whether the conductive layer 192 is disposed on the connecting recess 116, the light emitting device package may drive the light emitting devices, respectively, or may drive the plurality of light emitting devices. That is, since the driving voltage may be changed according to the number of connected light emitting devices, it is possible to provide a package capable of switching the driving voltage according to the purpose of use. That is, when the drive voltage of the individual light emitting device is 3 V, a common package may be provided to switch to 3 V or 6 V. A package, which has light emitting devices, the number of which is two or more times the number of frames and the number of connecting frames, may be provided so that it is possible to switch to a higher voltage.

<Semiconductor Module or Light Source Module>

FIG. 25 shows a semiconductor module or light source module having a light emitting device package according to the first to third embodiments. As one example, a light emitting module having the light emitting device package of the first embodiment will be described, and will be described below with reference to the description and the drawings disclosed above.

Referring to FIGS. 2 and 25, in the light source module according to an embodiment, one or plural light emitting device packages 100 may be disposed on a circuit board 201.

The circuit board 201 may include a substrate member having first to fourth pads 211 to 217. A power supply circuit for controlling the driving of the light emitting devices 151 and 153 may be provided to the circuit board 310.

Each of the frames of the light emitting device package 100 may be connected to the pads 211 to 217 of the circuit board 201. Thus, the first and second light emitting devices 151 and 153 of the light emitting device package 100 may receive power from each pad 211 to 217 of the circuit board. Each pad 211 to 217 of the circuit board 201 may include at least one selected from the group consisting of Ti, Cu, Ni, Au, Cr, Ta, Pt, Sn, Ag, P, Fe, Sn, Zn, Al, and the like or the alloy thereof.

Each of the pads 211 to 217 of the circuit board 201 may be arranged to overlap the frames 120, 132, 134 and 140 and the through-holes TH1 to TH4. Bonding layers 221 to 227 may be provided between the pads 211 to 217 and the frames 120, 132, 134 and 140. The bonding layers 221 to 227 may be connected to the frames 120 to 140 and/or the conductive layer 321 of each through-hole TH1 to TH4.

According to the light emitting device package of an embodiment, the bonding parts 51 to 54 of the light emitting devices 151 and 153 may receive driving power through the conductive layer 321 disposed in the through-holes TH1 to TH4 of the frames 120, 132, 134 and 140. In addition, the melting point of the conductive layer 321 disposed in the through-holes TH1 to TH4 may be selected to have a higher value than the melting point of the conventional bonding material. Therefore, even when the light emitting device package 100 according to an embodiment is bonded to a main substrate through a reflow process, since re-melting phenomenon does not occur, the electrical connection and physical bonding force are not deteriorated. According to the light emitting device package 100 and the light emitting device package manufacturing method of an embodiment, the package body 110 does not need to be exposed to a high temperature in the process of manufacturing a light emitting device package. Therefore, according to the embodiment, the package body 110 may be prevented from being exposed to high temperatures to be damaged or discolored.

The light emitting device package 100 according to an embodiment may be mounted on a sub-mount, a circuit board, or the like. However, when a conventional light emitting device package is mounted on a sub-mount, a circuit board or the like, a high temperature process such as reflow may be applied. In the reflow process, a re-melting phenomenon may occur in a bonding region between the frame provided in the light emitting device package and the light emitting device, so that the stability of the electrical connection and physical bonding may be deteriorated, thereby changing the position of the light emitting device and thus, the optical and electrical characteristics and reliability of the light emitting device package may be deteriorated. However, according to the light emitting device package of an embodiment, the first bonding portion of the light emitting device according to an embodiment may receive driving power through the conductive layer disposed in the through-hole. In addition, the melting point of the conductive layer disposed in the through-hole may be selected to have a higher value than the melting point of a conventional bonding material. Therefore, even when the light emitting device package 100 according to an embodiment is bonded to a main substrate through a reflow process, since re-melting phenomenon does not occur, the electrical connection and physical bonding force are not deteriorated.

FIG. 28 is a plan view illustrating a light emitting device according to an embodiment of the present invention, and FIG. 29 is a sectional view taken along the line F-F of a light emitting device shown in FIG. 28.

For better understanding, though disposed under the first bonding part 1171 and the second bonding part 1172, FIG. 28 shows a first sub-electrode 1141 electrically connected to the first bonding part 1171, and a second sub-electrode 1142 electrically connected to the second bonding part 1172.

As shown in FIG. 29, the light emitting device 1100 according to the embodiment may include a light emitting structure 1110 disposed on a substrate 1105.

The substrate 1105 may be selected from the group including a sapphire substrate (Al2O3), SiC, GaAs, GaN, ZnO, Si, GaP, InP and Ge. For example, the substrate 1105 may be provided as a patterned sapphire substrate (PSS) formed on an upper surface thereof with a concavo-convex pattern.

The light emitting structure 1110 may include a first conductivity type semiconductor layer 1111, an active layer 1112, and a second conductivity type semiconductor layer 1113. The active layer 1112 may be disposed between the first conductivity type semiconductor layer 1111 and the second conductivity type semiconductor layer 1113. For example, the active layer 1112 may be disposed on the first conductivity type semiconductor layer 1111, and the second conductivity type semiconductor layer 1113 may be disposed on the active layer 1112.

The light emitting device 1100 according to the embodiment may include a transparent electrode layer 1130. The transparent electrode layer 1130 may increase light output by improving a current diffusion. For example, the transparent electrode layer 1130 may include at least one selected from the group including a metal, metal oxide, and metal nitride. The transparent electrode layer 1130 may include a light transmissive material. The transparent electrode layer 1130 may include selected from the group including indium tin oxide (ITO), indium zinc oxide (IZO), IZO nitride (IZON), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, Ni/IrOx/Au/ITO, Pt, Ni, Au, Rh, and Pd.

The light emitting device 1100 according to the embodiment may include a reflective layer 1160. The reflective layer 1160 may include a first reflective layer 1161, a second reflective layer 1162, and a third reflective layer 1163. The reflective layer 1160 may be disposed on the transparent electrode layer 1130. The second reflective layer 1162 may include a first opening h1 for exposing the transparent electrode layer 1130. The second reflective layer 1162 may include a plurality of first openings h1 disposed on the transparent electrode layer 1130. The first reflective layer 1161 may include second openings h2 for exposing an upper surface of the first conductivity type semiconductor layer 1111.

The third reflective layer 1163 may be disposed between the first reflective layer 1161 and the second reflective layer 1162. For example, the third reflective layer 1163 may be connected to the first reflective layer 1161. In addition, the third reflective layer 1163 may be connected to the second reflective layer 1162. The third reflective layer 1163 may be disposed while physically making direct contact with the first reflective layer 1161 and the second reflective layer 1162.

The reflective layer 1160 according to the embodiment may make contact with the second conductivity type semiconductor layer 1113 through contact holes provided in the transparent electrode layer 1130. The reflective layer 1160 may physically make contact with an upper surface of the second conductivity type semiconductor layer 1113 through the contact holes provided in the transparent electrode layer 1130.

The reflective layer 1160 may be provided as an insulating reflective layer. For example, the reflective layer 1160 may be provided as a distributed Bragg reflector (DBR) layer. In addition, the reflective layer 1160 may be provided as an omni directional reflector (ODR) layer. In addition, the reflective layer 1160 may be provided by stacking the DBR layer and the ODR layer.

The light emitting device 1100 according to the embodiment may include the first sub-electrode 1141 and the second sub-electrode 1142. The first sub-electrode 1141 may be electrically connected to the first conductivity type semiconductor layer 1111 in the second opening h2. The first sub-electrode 1141 may be disposed on the first conductivity type semiconductor layer 1111. For example, according to the light emitting device 1100 of the embodiment, the first sub-electrode 1141 may be disposed on the upper surface of the first conductivity type semiconductor layer 1111 within the recess disposed to a partial region of the first conductivity type semiconductor layer 1111 through the second conductivity type semiconductor layer 1113 and the active layer 1112.

The first sub-electrode 1141 may be electrically connected to the upper surface of the first conductivity type semiconductor layer 1111 through the second opening h2 provided in the first reflective layer 1161. The second opening h2 and the recess may vertically overlap each other. For example, the first sub-electrode 1141 may make direct contact with the upper surface of the first conductivity type semiconductor layer 1111 in recess regions.

The second sub-electrode 1142 may be electrically connected to the second conductivity type semiconductor layer 1113. The second sub-electrode 1142 may be disposed on the second conductivity type semiconductor layer 1113. According to the embodiment, the transparent electrode layer 1130 may be disposed between the second sub-electrode 1142 and the second conductivity type semiconductor layer 1113.

The second sub-electrode 1142 may be electrically connected to the second conductivity type semiconductor layer 1113 through the first opening h1 provided in the second reflective layer 1162. For example, the second sub-electrode 1142 may be electrically connected to the second conductivity type semiconductor layer 1113 through the transparent electrode layer 1130 in P regions.

The second sub-electrode 1142 may make direct contact with an upper surface of the transparent electrode layer 1130 through a plurality of first openings h1 provided in the second reflective layer 1162 in the P regions. According to the embodiment, the first sub-electrode 1141 and the second sub-electrode 1142 may have polarities to each other and may be spaced apart from each other.

The first sub-electrode 1141 and the second sub-electrode 1142 may be formed with a structure having a single layer or multiple layers. For example, the first sub-electrode 1141 and the second sub-electrode 1142 may be ohmic electrodes. For example, the first sub-electrode 1141 and the second sub-electrode 1142 may include at least one or an alloy formed of at least two of ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf. An region R11, R12 and R13 in FIG. 29 shows to distinguish overlapping regions for each of the sub-electrodes.

The light emitting device 1100 according to the embodiment may include a protective layer 1150. The protective layer 1150 may include third openings h3 for exposing the second sub-electrode 1142. The third openings h3 may be disposed corresponding to PB regions provided in the second sub-electrode 1142. In addition, the protective layer 1150 may include fourth openings h4 for exposing the first sub-electrode 1141. The fourth openings h4 may be disposed corresponding to NB regions provided in the first sub-electrode 1141. The protective layer 1150 may be disposed on the reflective layer 1160. The protective layer 1150 may be disposed on the first reflective layer 1161, the second reflective layer 1162, and the third reflective layer 1163. For example, the protective layer 1150 may be provided as an insulating material. For example, the protective layer 1150 may be formed of at least one material selected from the group including SixOy, SiOxNy, SixNy, and AlxOy.

The light emitting device 1100 according to the embodiment may include the first bonding part 1171 and the second bonding part 1172 disposed on the protective layer 1150. The first bonding part 1171 may be disposed on the first reflective layer 1161. In addition, the second bonding part 1172 may be disposed on the second reflective layer 1162. The second bonding part 1172 may be spaced apart from the first bonding part 1171. The first bonding part 1171 may make contact with an upper surface of the first sub-electrode 1141 through the fourth openings h4 provided in the protective layer 1150 in the NB regions. The NB regions may be vertically offset with the second opening h2. When the plurality of NB regions and the second opening h2 are vertically offset from each other, a current injected into the first bonding part 1171 may be uniformly distributed in a horizontal direction of the first sub-electrode 1141, thus the current may be uniformly injected in the NB regions.

In addition, the second bonding part 1172 may make contact with an upper surface of the second sub-electrode 1142 through the third openings h3 provided in the protective layer 1150 in the PB regions. When the PB regions and the first openings h1 are not vertically overlapped with each other, a current injected into the second bonding part 1172 may be uniformly distributed in a horizontal direction of the second sub-electrode 1142, thus the current may be uniformly injected in the PB regions. Thus, according to the embodiment, because the power may be supplied through the regions, a current dispersion effect can be generated and an operating voltage can be reduced according to the increase of a contact area and the dispersion of a contact region.

Accordingly, the first reflective layer 1161 and the second reflective layer 1162 reflect light emitted from the active layer 1112 of the light emitting structure 1110 to minimize the optical absorption in the first sub-electrode 1141 and the second sub-electrode 1142, so that light intensity Po can be improved. The first reflective layer 1161 and the second reflective layer 1162 may have a DBR structure in which materials having different refractive indexes are alternately disposed. For example, the first reflective layer 1161 and the second reflective layer 1162 may be disposed in a single layer or a stacked structure including at least one of $TiO_2$, $SiO_2$, $Ta_2O_5$, and $HfO_2$. Without the limitation thereto, according to another embodiment, the first reflective layer 1161 and the second reflective layer 1162 may freely selected to adjust the reflectivity to the light emitted from the active layer 1112 according to a wavelength of the light emitted from the active layer 1112. In addition, according to another embodiment, the first reflective layer 1161 and the second reflective layer 1162 may be provided as the ODR layer. According to still another embodiment, the first reflective layer 1161 and the second reflective layer 1162 may be provided as a sort of hybrid type in which the DBR layer and the ODR layer are stacked.

When the light emitting device according to the embodiment is implemented as a light emitting device package after being mounted by a flip chip bonding scheme, light provided from the light emitting structure 1110 may be emitted through the substrate 1105. The light emitted from the light emitting structure 1110 may be reflected by the first reflective layer 1161 and the second reflective layer 1162 and emitted toward the substrate 1105.

In addition, the light emitted from the light emitting structure 1110 may be emitted in the lateral direction of the light emitting structure 1110. In addition, the light emitted from the light emitting structure 1110 may be emitted to the outside through a region where the third reflective layer 1163 is not provided among the surfaces on which the first bonding part 1171 and the second bonding part 1172 are disposed.

Accordingly, the light emitting device 1100 according to the embodiment may emit the light in six-surfaced directions surrounding the light emitting structure 1110, and remarkably improve the light intensity.

Meanwhile, according to the light emitting device of the embodiment, when viewed from the top of the light emitting device 1100, the sum of the areas of the first bonding part 1171 and the second bonding part 1172 is less than or equal to 60% of the total area of the upper surface of the light emitting device 1100 on which the first bonding part 1171 and the second bonding part 1172 are disposed.

For example, the total area of the upper surface of the light emitting device 1100 may correspond to the area defined by a lateral length and a longitudinal length of the lower surface of the first conductivity type semiconductor layer 1111 of the light emitting structure 1110. In addition, the total area of the upper surface of the light emitting device 1100 may correspond to the area of an upper surface or a lower surface of the substrate 1105.

Accordingly, the sum of the areas of the first bonding part 1171 and the second bonding part 1172 is equal to or less than 60% of the total area of the light emitting device 1100, so that the amount of light emitted to the surface on which the first bonding part 1171 and the second bonding part 1172 are disposed may be increased. Thus, according to the embodiment, because the amount of the light emitted in the six-surfaced directions of the light emitting device 1100 is increased, the light extraction efficiency may be improved and the light intensity Po may be increased.

In addition, when viewed from the top of the light emitting device, the sum of the areas of the first bonding part 1171 and the second bonding part 1172 is equal to or greater than 30% of the total area of the light emitting device 1100.

Accordingly, the sum of the areas of the first bonding part 1171 and the second bonding part 1172 is equal to or greater than 30% of the total area of the light emitting device 1100, so that a stable mount may be performed through the first bonding part 1171 and the second bonding part 1172, and electrical characteristics of the light emitting device 1100 may be ensured.

The sum of the areas of the first bonding part 1171 and the second bonding part 1172 may be selected as 30% to 60% with respect to the total area of the light emitting device 1100 in consideration of ensuring the light extraction efficiency and the bonding stability.

In other words, when the sum of the areas of the first bonding part 1171 and the second bonding part 1172 is 30% to 100% with respect to the total area of the light emitting device 1100, the electrical characteristics of the light emitting device 1100 may be ensured and bonding strength to be mounted on the light emitting device package may be ensured, so that stable mount may be performed.

In addition, when the sum of the areas of the first bonding part 1171 and the second bonding part 1172 is more than 0% and equal to or less than 60% of the total area of the light emitting device 1100, the amount of light emitted to the surface on which the first bonding part 1171 and the second bonding part 1172 are disposed increases, so that the light extraction efficiency of the light emitting device 1100 may be improved and the light intensity Po may be increased.

In the embodiment, the sum of the areas of the first bonding part 1171 and the second bonding part 1172 is selected as 30% to 60% of the total area of the light emitting device 1100 so as to ensure the electrical characteristics of the light emitting device 1100 and the bonding strength to be mounted on the light emitting device package and increase the light intensity.

In addition, according to the light emitting device 1100 of the embodiment, the third reflective layer 1163 may be disposed between the first bonding part 1171 and the second bonding part 1172. For example, the length W5 of the third reflective layer 1163 in major axial direction of the light emitting device 1100 may correspond to the distance between the first bonding part 1171 and the second bonding part 1172. In addition, for example, the area of the third reflective layer 1163 may be 10% to 25% of the entire upper surface of the light emitting device 1100.

When the area of the third reflective layer 1163 is 10% or more of the entire upper surface of the light emitting device 1100, the package body disposed under the light emitting device may be prevented from being discolored or cracked. When being 25% or less, it is advantageous to ensure the light extraction efficiency for emitting light to six surfaces of the light emitting device.

In addition, without limited thereto in another embodiment, the area of the third reflective layer 1163 may be arranged to more than 0% and less than 10% of the entire upper surface of the light emitting device 1100 to ensure the light extraction efficiency more, and the area of the third reflective layer 1163 may be arranged to more than 25% and less than 100% of the entire upper surface of the light emitting device 1100 to prevent the package body from being discolored or cracked.

In addition, the light generated from the light emitting structure 1110 may be transmitted and emitted through a second region provided between a side surface arranged in the major axial direction and the first bonding part 1171 or the second bonding part 1172 adjacent to the side surface.

In addition, the light generated from the light emitting structure 1110 may be transmitted and emitted through a third region provided between a side surface arranged in a minor axial direction and the first bonding part 1171 or the second bonding part 1172 adjacent to the side surface.

According to the embodiment, the size of the first reflective layer 1161 may be several micrometers larger than the size of the first bonding part 1171. For example, the area of the first reflective layer 1161 may be provided in a size to completely cover the area of the first bonding part 1171. In consideration of a process error, for example, the length of one side of the first reflective layer 1161 may be greater than the length of one side of the first bonding part 1171 by about 4 micrometers to about 10 micrometers.

In addition, the size of the second reflective layer 1162 may be several micrometers larger than the size of the second bonding part 1172. For example, the area of the second reflective layer 1162 may be provided in a size to completely cover the area of the second bonding part 1172. In consideration of a process error, for example, the length of one side of the second reflective layer 1162 may be greater than the length of one side of the second bonding part 1172 by about 4 micrometers to about 10 micrometers.

According to the embodiment, light emitted from the light emitting structure 1110 may be reflected without being incident on the first bonding part 1171 and the second bonding part 1172 by the first reflective layer 1161 and the second reflective layer 1162. Thus, according to the embodiment, a loss of the light generated and emitted from the light emitting structure 1110 and incident to the first bonding part 1171 and the second bonding part 1172 may be minimized.

In addition, according to the light emitting device 1100 of the embodiment, because the third reflective layer 1163 is disposed between the first bonding part 1171 and the second bonding part 1172, the amount of light emitted between the first bonding part 1171 and the second bonding part 1172 may be adjusted.

As described above, the light emitting device 1100 according to the embodiment may be provided as a light emitting device package after being mounted, for example, in a flip chip bonding scheme. Herein, when the package body mounted thereon with the light emitting device 1100 is provided with resin or the like, the package body is discolored or cracked in the lower region of the light emitting device 1100 due to strong short-wavelength light emitted from the light emitting device 1100.

However, according to the light emitting device 1100 of the embodiment, because the amount of light emitted between the region on which the first bonding part 1171 and the second bonding part 1172 are disposed is adjusted, the package body disposed in the lower region of the light emitting device 1100 may be prevented from being discolored or cracked.

According to the embodiment, the light generated from the light emitting structure 1100 may be transmitted and emitted through 20% or more of the area of the upper surface of the light emitting device 1100 on which the first bonding part 1171, the second bonding part 1172 and the third reflective layer 1163.

Thus, according to the embodiment, because the amount of the light emitted in the six-surfaced directions of the light emitting device 1100 is increased, the light extraction efficiency may be improved and the light intensity Po may be increased. In addition, the package body disposed adjacent to the lower surface of the light emitting device 1100 may be prevented from being discolored or cracked.

In addition, according to the light emitting device 1100 of the embodiment, a plurality of contact holes C1, C2, and C3 may be provided in the transparent electrode layer 1130. The second conductivity type semiconductor layer 1113 may be bonded to the reflective layer 1160 through the plurality of contact holes C1, C2, and C3 provided in the transparent electrode layer 1130. The reflective layer 1160 makes directly contact with the second conductivity type semiconductor layer 1113, so that the adhesive strength may be improved as compared with the case that the reflective layer 1160 makes contact with the transparent electrode layer 1130.

When the reflective layer 1160 makes direct contact with only the transparent electrode layer 1130, the bonding strength or adhesive strength between the reflective layer 1160 and the transparent electrode layer 1130 may be weakened. For example, when an insulating layer is bonded to a metal layer, the bonding strength or adhesive strength between the materials thereof may be weakened.

For example, when the bonding strength or adhesive strength between the reflective layer 1160 and the transparent electrode layer 1130 is weak, peeling may incur between the two layers. Thus, when the peeling incurs between the reflective layer 1160 and the transparent electrode layer 1130, the characteristics of the light emitting device 1100 may deteriorate and the reliability of the light emitting device 1100 may not be ensured.

However, according to the embodiment, because the reflective layer 1160 can make direct contact with the second conductivity type semiconductor layer 1113, the bonding strength and adhesive strength may be stably provided between the reflective layer 1160, the transparent electrode layer 1130, and the second conductivity type semiconductor layer 1113.

Thus, according to the embodiment, because the bonding strength between the reflective layer 1160 and the second conductivity type semiconductor layer 1113 may be stably provided, the reflective layer 1160 may be prevented from being peeled off from the transparent electrode layer 1130. In addition, because the bonding strength between the reflective layer 1160 and the second conductivity type semiconductor layer 1113 may be stably provided, the reliability of the light emitting device 1100 may be improved.

Meanwhile, as described above, the transparent electrode layer 1130 may be provided with the contact holes C1, C2, and C3. The light emitted from the active layer 1112 may be incident to and reflected by the reflective layer 1160 through the contact holes C1, C2, and C3 provided in the transparent electrode layer 1130. Accordingly, the loss of the light generated from the active layer 1112 and incident to the transparent electrode layer 1130 is reduced, so that the light extraction efficiency may be improved. Thus, according to the light emitting device 1100 of the embodiment, the light intensity may be improved.

As described above, according to the semiconductor device package and the method of manufacturing a semiconductor device package of an embodiment, the bonding parts of the light emitting device 120 of the embodiment may be receive by driving power supplied through the conductive layer which is disposed at the through hole. In addition, the melting point of the conductive layer disposed in the through-hole may be selected to have a higher value than the melting point of a conventional bonding material. Therefore, even when the light emitting device package 100 according to an embodiment is bonded to a main substrate through a reflow process, since re-melting phenomenon does not occur, the electrical connection and physical bonding force are not deteriorated.

In addition, according to the light emitting device package 100 of an embodiment, the package body 110 does not need to be exposed to a high temperature in the process of manufacturing a light emitting device package. Therefore, according to the embodiment, the package body may be prevented from being exposed to high temperatures to be damaged or discolored. Accordingly, the selection range for the material constituting the body 115 may be widened. According to an embodiment, the body may be provided by using a relatively inexpensive resin material as well as an expensive material such as ceramic.

Meanwhile, the light emitting device package according to an embodiment may be applied to a light source unit.

In addition, the light source unit may include a display device, a lighting device, a head lamp, and the like according to an industrial field.

As an example of the light source unit, a display device may include a bottom cover, a reflector disposed on the bottom cover, a light emitting module including a light emitting device that emits light, a light guide plate disposed in front of the reflector and guiding light emitted from the light emitting module forward, an optical sheet including prism sheets disposed in front of the light guide plate, a display panel disposed in front of the optical sheet, an image signal output circuit connected to the display panel to supply an image signal to the display panel, and a color filter disposed in front of the display panel. In this case, the bottom cover, the reflector, the light emitting module, the light guide plate, and the optical sheet may constitute a backlight unit. In addition, the display device may have a structure in which light emitting devices that emit red, green and blue light are disposed, respectively.

As still another example of the light source unit, the head lamp may include a light emitting module including a light emitting device package disposed on a substrate, a reflector for reflecting light emitted from the light emitting module in a predetermined direction, for example, forward, a lens for refracting light reflected by the reflector forward, and a shade for constructing a light distribution pattern desired by designer by blocking or reflecting a portion of the light that is reflected by the reflector to be directed to the lens.

As another example of the light source unit, the lighting device may include a cover, a light source module, a heat radiator, a power supply, an inner case, and a socket. In addition, the light source unit according to an embodiment may further include at least one of a member and a holder. The light source module may include a light emitting device package according to an embodiment.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A light emitting device package comprising:
a first frame having a first through hole;
a second frame having a second through hole;
a connecting frame diagonally extending in the light emitting device package from the first frame to the second frame;
a first light emitting device including a first electrode pad and a second electrode pad, the second electrode pad being disposed on the first through hole of the first frame;
a second light emitting device including a third electrode pad and a fourth electrode pad, the third electrode pad being disposed on the second through hole of the second frame; and
an inner wall part between the first light emitting device and the second light emitting device,
wherein the inner wall part is disposed on the connecting frame.

2. The light emitting device package of claim 1, wherein the first frame and the second frame are diagonally spaced apart from each other in the light emitting device package.

3. The light emitting device package of claim 1, further comprising a third frame having a third through hole and a fourth frame having a fourth through hole, the third frame and the fourth frame being diagonally spaced apart from each other in the light emitting device package.

4. The light emitting device package of claim 3, wherein the first electrode pad of the first light emitting device is disposed on the third through hole of the third frame,
wherein the fourth electrode pad of the second light emitting device is disposed on the fourth through hole,
wherein the first light emitting device is electrically connected to the first frame and the third frame, and
wherein the second light emitting device is electrically connected to the second frame and the fourth frame.

5. The light emitting device package of claim 3, further comprising a body supporting the first to fourth frames and the connecting frame,
wherein the body comprises at least one recess interposed between the first frame and the third frame, or between the second frame and the fourth frame so that the first light emitting device or the second light emitting device overlaps the at least one recess.

6. The light emitting device package of claim 5, wherein a resin is disposed in the at least one recess.

7. The light emitting device package of claim 5, wherein the at least one recess includes a first recess interposed between the first frame and the third frame, and a second recess interposed between the second frame and the fourth frame, and
wherein the connecting frame is interposed between the first recess and the second recess.

8. The light emitting device package of claim 3, wherein an end portion of the first frame facing the third frame has a concave portion, and
wherein the concave portion is concave in a direction from the end portion of the first frame to the first through hole.

9. The light emitting device package of claim 3, wherein each of the first frame, the second frame, the third frame, and the fourth frame has a concave portion.

10. The light emitting device package of claim 1, wherein the inner wall part extends parallel to both the first light emitting device and the second light emitting device, and
wherein the inner wall part is spaced apart from the first light emitting device and the second light emitting device.

11. A light emitting device package comprising:
a first frame having a first through hole;
a second frame having a second through hole;
a connecting frame diagonally extending in the light emitting device package from the first frame to the second frame, the connecting frame having a through hole that separates the connecting frame into a first part and a second part;
a first light emitting device including a first electrode pad and a second electrode pad, the second electrode pad being disposed on the first through hole of the first frame;
a second light emitting device including a third electrode pad and a fourth electrode pad, the third electrode pad being disposed on the second through hole of the second frame; and
an inner wall part between the first light emitting device and the second light emitting device,
wherein the inner wall part is disposed on the first part and the second part of the connecting frame.

12. The light emitting device package of claim 11, wherein a conductive material is provided in the through hole of the connecting frame so that the first frame and the second frame are electrically connected, and the first light emitting device and the second emitting device are series connected.

13. The light emitting device package of claim 11, wherein a dielectric material is provided in the through hole of the connecting frame so that the first frame and the second frame are electrically isolated, and the first light emitting device and the second emitting device are parallel connected.

14. The light emitting device package of claim 11, further comprising a package body including a cavity and surrounding the first light emitting device and the second light emitting device,
wherein the first light emitting device and the second light emitting device are disposed in the cavity, and
wherein the first frame and the second frame are diagonally spaced apart from each other in the light emitting device package.

15. The light emitting device package of claim 11, further comprising a third frame having a third through hole and a fourth frame having a fourth through hole, the third frame and the fourth frame being diagonally spaced apart from each other in the light emitting device package.

16. The light emitting device package of claim 15, wherein the first electrode pad of the first light emitting device is disposed on the third through hole of the third frame, wherein the fourth electrode pad of the second light emitting device is disposed on the fourth through hole, wherein the first light emitting device is electrically connected to the first frame and the third frame, and wherein the second light emitting device is electrically connected to the second frame and the fourth frame.

17. The light emitting device package of claim 15, further comprising a body supporting the first to fourth frames and the connecting frame, wherein the body comprises at least one recess interposed between the first frame and the third frame, or between the second frame and the fourth frame so that the first light emitting device or the second light emitting device overlaps the at least one recess.

18. The light emitting device package of claim 17, wherein a resin is disposed in the at least one recess.

19. The light emitting device package of claim 17, wherein the at least one recess includes a first recess interposed between the first frame and the third frame, and a second recess interposed between the second frame and the fourth frame, and wherein the connecting frame is interposed between the first recess and the second recess.

20. The light emitting device package of claim 15, wherein an end portion of the first frame facing the third frame has a concave portion, and wherein the concave portion is concave in a direction from the end portion of the first frame to the first through hole.

21. The light emitting device package of claim 11, wherein the inner wall part extends parallel to both the first light emitting device and the second light emitting device, and wherein the inner wall part is spaced apart from the first light emitting device and the second light emitting device.

\* \* \* \* \*